(12) United States Patent
Kohkaki et al.

(10) Patent No.: US 10,042,905 B2
(45) Date of Patent: Aug. 7, 2018

(54) INFORMATION PROCESSING APPARATUS, INFORMATION PROCESSING SYSTEM, AND DATA CONVERSION METHOD

(71) Applicants: Tetsuharu Kohkaki, Kanagawa (JP); Kunio Okita, Kanagawa (JP); Yasuharu Fukuda, Kanagawa (JP); Kazunori Takatsu, Kanagawa (JP)

(72) Inventors: Tetsuharu Kohkaki, Kanagawa (JP); Kunio Okita, Kanagawa (JP); Yasuharu Fukuda, Kanagawa (JP); Kazunori Takatsu, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 709 days.

(21) Appl. No.: 13/748,739

(22) Filed: Jan. 24, 2013

(65) Prior Publication Data

US 2013/0198211 A1 Aug. 1, 2013

(30) Foreign Application Priority Data

Feb. 1, 2012 (JP) .................................. 2012-020122
Dec. 27, 2012 (JP) .................................. 2012-285038

(51) Int. Cl.
*G06F 17/30* (2006.01)
*H03M 7/00* (2006.01)

(52) U.S. Cl.
CPC .. *G06F 17/30569* (2013.01); *G06F 17/30076* (2013.01); *H03M 7/00* (2013.01)

(58) Field of Classification Search
CPC ......... G06F 17/30011; G06F 17/30067; G06F 17/30076; G06F 17/30179; G06F 17/30867; G06F 17/30233
See application file for complete search history.

(56) References Cited

U.S. PATENT DOCUMENTS

| 5,513,323 | A | 4/1996 | Williams et al. |
| 5,708,828 | A | 1/1998 | Coleman |
| 7,904,811 | B2 | 3/2011 | Saito |
| 2001/0002470 | A1* | 5/2001 | Inohara et al. ................... 707/1 |

(Continued)

FOREIGN PATENT DOCUMENTS

| CN | 101098483 | 1/2008 |
| JP | H05-127961 | 5/1993 |
| JP | 2001-075844 | 3/2001 |

(Continued)

OTHER PUBLICATIONS

Priss, Uta. "FcaStone-FCA file format conversion and interoperability software." Conceptual Structures Tools and the Web (2008): 33.*

(Continued)

*Primary Examiner* — Nan Hutton
(74) *Attorney, Agent, or Firm* — IPUSA, PLLC

(57) ABSTRACT

An information processing apparatus may include a plurality of converting units respectively configured to execute a predetermined data conversion from one data format to another data format, and a control unit. The control unit may coordinate the converting units based on a conversion request to convert electronic data in a first data format into electronic data in a second data format, in order to make the converting units execute a data conversion from the first data format to the second data format.

18 Claims, 27 Drawing Sheets

(56) References Cited

U.S. PATENT DOCUMENTS

2004/0109186 A1    6/2004  Shindoh et al.
2011/0047233 A1*   2/2011  Park .................. H04W 4/18
                                                    709/206

FOREIGN PATENT DOCUMENTS

| JP | 2004-166222 | 6/2004 |
| JP | 2006-081081 | 3/2006 |
| JP | 2009-075689 | 4/2009 |
| WO | 96/37817    | 11/1996 |

OTHER PUBLICATIONS

Hamilton, Eric. "JPEG file interchange format." (2004).*
Chinese Office Action dated May 28, 2015.
Japanese Office Action dated Sep. 13, 2016.
The Extended European search report dated Dec. 12, 2016.
Anonymous: "Data conversion—Wikipedia", Dec. 23, 2011 (Dec. 23, 2011), XP055323734, Retrieved from the Internet <URL:https://en.wikipedia.org/w/index.php?title=Data_conversion&oldid=467347345> [retrieved on Nov. 28, 2016].

* cited by examiner

FIG.11

| ORGANIZATION CODE | ORGANIZATION NAME | COUNTRY | LANGUAGE | ADDRESS INFORMATION | ... |
|---|---|---|---|---|---|
| XXX | COMPANY A | JAPAN | JAPANESE | CompanyA@print.com | |
| YYY | COMPANY B | U.S.A | ENGLISH | CompanyB@print.com | |

FIG.12

| ORGANIZATION CODE | USER NAME | PASSWORD | ADDRESS INFORMATION | ... |
|---|---|---|---|---|
| XXX | User A | AAA | A@aaa.com | |
| | User B | BBB | B@aaa.com | |
| | User C | CCC | C@aaa.com | |
| YYY | User A | AAA | A@bbb.com | |
| | User D | DDD | D@bbb.com | |

FIG.13

| ORGANIZATION CODE | DEVICE AUTHENTICATION INFORMATION | OFFICE INFORMATION | CAPABILITY | ... |
|---|---|---|---|---|
| XXX | 111 | OFFICE A | A4 COLOR MACHINE | |
| | 222 | OFFICE B | A2 COLOR MACHINE | |
| | 333 | OFFICE B | A4 MONOCHROMATIC MACHINE | |
| YYY | 444 | — | A4 COLOR MACHINE | |

FIG.19

(1) When Worker (img2rpcs) acquires own job, virtual task queue state = 1 task "img2rpcs".

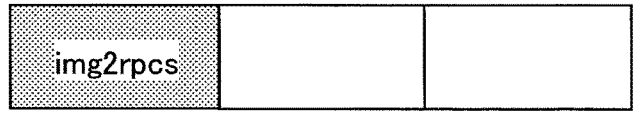

(2) Worker (img2rpcs) adds new task required for own conversion. Task queue includes 2 tasks "img2rpcs", "img2pdf" & "pdf2rpcs".

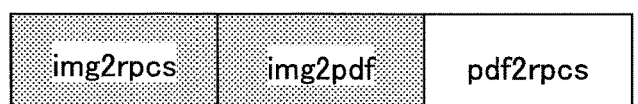

(3) Worker (img2rpcs) checks task at start of queue.

Dequeues job.

(4) Worker (img2rpcs) deletes own task after adding tasks. Task queue includes 2 tasks "img2pdf" & "pdf2rpcs".

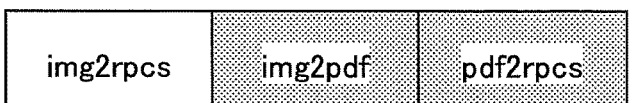

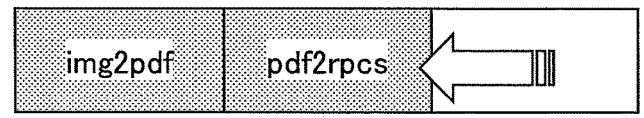

(5) Worker (img2rpcs) checks task at start of queue & enqueues job into corresponding queue.

FIG.20

- Status = doing
- Task
    - Conversion Type = img2rpcs
    - File = A.jpg of Data Storage
- Task Execution Results
    - Conversion Type = img2rpcs
    - Results
        - Character string indicating that segmenting has been made

FIG.21
(1) When Worker (img2pdf) acquires own job, task queue state = 2 tasks "img2pdf" & "pdf2rpcs".
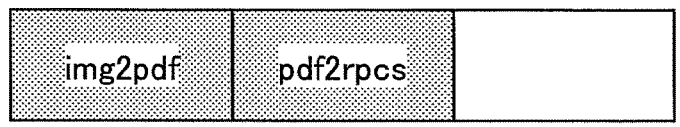
(2) Worker (img2pdf) checks task at start of queue, and
    acquires file
    opens file
    converts file
    uploads file
    dequeues job
(3) Worker (img2pdf) deletes own task. Task queue includes 1 task "pdf2rpcs".
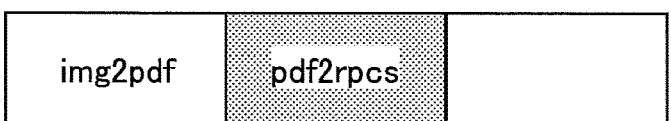
Delete
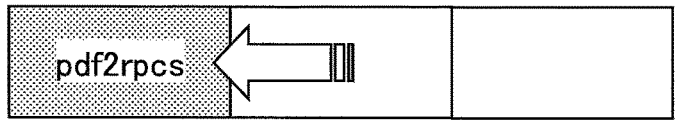
(4) Worker (img2pdf) checks task at start of queue & enqueues job into corresponding queue.

FIG.22

- Status = doing
- Task
  - Conversion Type = img2rpcs
  - File = A.jpg of Data Storage
- Task Execution Results
  - Conversion Type = img2rpcs
  - File = A.jpg
  - Results
    - Converted File = A.pdf of Data Storage

FIG.23
(1) When Worker (pdf2rpcs) acquires own job, task queue state = 1 task "pdf2rpcs".
Task Queue 
(2) Worker (pdf2rpcs) checks task at start of queue, and
    acquires file
    opens file
    converts file
    uploads file
    dequeues job
(3) Worker (pdf2rpcs) deletes own task.
Task queue becomes empty.
Task Queue 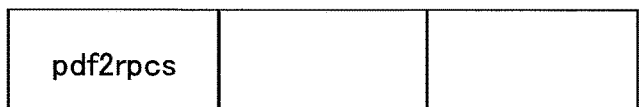
Delete
Task Queue 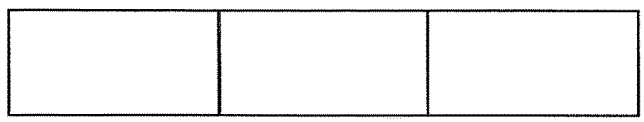

FIG.24

- Status = done
- Task
    - Conversion Type = img2rpcs
    - File = A.jpg of Data Storage
- Task Execution Results
    - Conversion Type = img2rpcs
    - File = A.jpg of Data Storage, A.pdf of Data Storage
    - Results
        - Converted File = A.rpcs of Data Storage

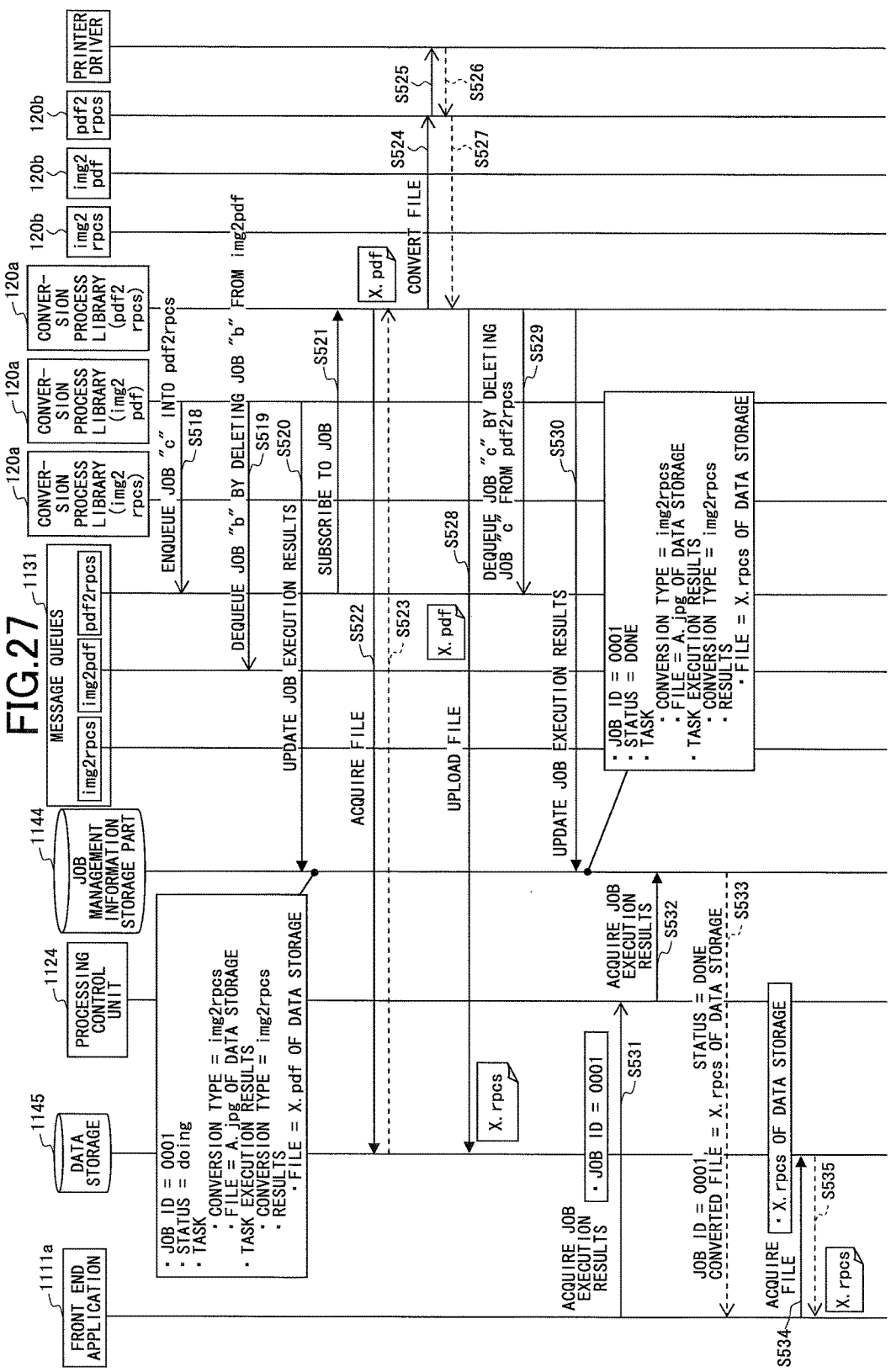

INFORMATION PROCESSING APPARATUS, INFORMATION PROCESSING SYSTEM, AND DATA CONVERSION METHOD

CROSS-REFERENCE TO RELATED APPLICATIONS

This application is based upon and claims the benefit of priority of the Japanese Patent Applications No. 2012-020122, filed on Feb. 1, 2012, and No. 2012-285038, filed on Dec. 27, 2012, the entire contents of which are incorporated herein by reference.

BACKGROUND OF THE INVENTION

1. Field of the Invention

The present invention generally relates to an information processing apparatus, an information processing system, and a data conversion method. The present invention also relates to a non-transitory computer-readable storage medium having stored therein a program for causing a computer to execute an information processing or a data conversion process.

2. Description of the Related Art

Conventionally, electronic data in a certain data format may be converted into electronic data in another data format, such as when a printer driver converts an office document into print data, for example. A data conversion process to convert the electronic data into a format that is suited for use at the time of outputting the electronic data is known from a Japanese Laid-Open Patent Publication No. 2006-81081, for example.

In addition, the data conversion process is not limited to that performed in a single computer, and the data conversion process may be performed in a computer system that uses a plurality of computers, as proposed in a Japanese Laid-Open Patent Publication No. 2009-75689, for example.

When making the conversion from one data format into another data format, a data conversion engine (or a data conversion program or a data conversion library) may be used in order to improve the independence or maintenance ease of the program.

However, the number of types of data conversion engines that are required to perform this conversion corresponds to the number of types of pairs formed by the number of types of input data formats and the number of types of output data formats. For example, when there are three (3) types of data format candidates for the data format before the conversion and there are three (3) types of data format candidates for the data format after the conversion, nine (9) types of data conversion engines are required in accordance with the number of types of pairs formed by the number of types of input data formats and the number of types of output data formats. In other words, the larger the number of options for the data formats before or after the conversion, the larger the number of types of data conversion engines that need to be prepared.

Hence, as the number of options for the data formats before or after the conversion increases, the number of types of data conversion engines that need to be prepared increases. As a result, when the number of options for the data formats before or after the conversion is relatively large, it may be difficult to flexibly cope with the increase in the number of types of data conversion engines that need to be prepared.

SUMMARY OF THE INVENTION

Accordingly, it is a general object in one embodiment of the present invention to provide a novel and useful information processing apparatus, information processing system, and data conversion method, in which the problem described above may be suppressed.

According to one aspect of the embodiment, the information processing apparatus, the information processing system, and the data conversion method may flexibly cope with an increase in the number of types of data conversion processes.

According to one aspect of the embodiment, a plurality of converting units (or means) may respectively execute a predetermined data conversion from one data format to another data format, and a control unit (or means) may coordinate or link the plurality of converting units (or means), based on a conversion request to convert electronic data in a first data format into electronic data in a second data format, in order to make the plurality of converting units (or means) execute a data conversion from the first data format to the second data format.

Other objects and further features of the present invention will be apparent from the following detailed description when read in conjunction with the accompanying drawings.

BRIEF DESCRIPTION OF THE DRAWINGS

FIG. 11 is a diagram illustrating an example of a structure of organization management information;

FIG. 12 is a diagram illustrating an example of a structure of user management information;

FIG. 13 is a diagram illustrating an example of a structure of apparatus management information;

FIG. 19 is a diagram for explaining an example of a process of step S304;

FIG. 20 is a diagram illustrating an example of a data structure of job management information after execution results of a job "a" are written;

FIG. 21 is a diagram for explaining an example of a process of step S308;

FIG. 22 is a diagram illustrating an example of a data structure of the job management information after execution results of a job "b" are written;

FIG. 23 is a diagram for explaining an example of a process of step S312;

FIG. 24 is a diagram illustrating an example of a data structure of the job management information after execution results of a job "c" are written;

FIG. 27 is a sequence diagram illustrating the example of the asynchronous data conversion process utilizing the plurality of data format converting units.

DESCRIPTION OF THE PREFERRED EMBODIMENTS

Figure 1:
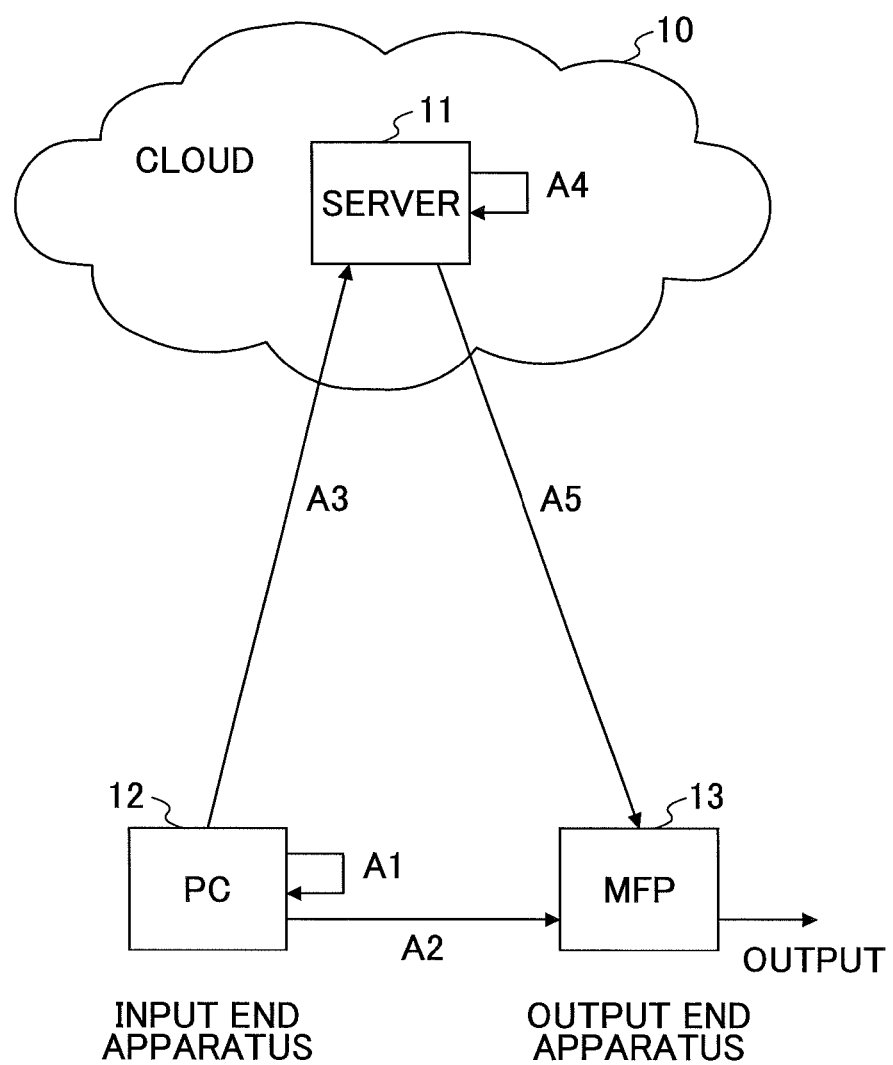
FIG. 1 is a diagram for explaining a cloud printing.

A description will be given of embodiments of the present invention, by referring to the drawings.

First Embodiment

A description will first be given of the utilization format of this embodiment, and a description will next be given of the functional structure and operation of this embodiment.

(Cloud Printing)

In this specification, a "cloud printing" refers to a cloud computing type printing service. The cloud printing will be described by referring to FIG. 1. FIG. 1 is a diagram for explaining the cloud printing.

According to the conventional technique, an input end apparatus (for example, a PC (Personal Computer) 12) may convert an electronic document file created by a work processor application into print data in a RPCS ((Refined Printing Command Stream), which is a page description language developed by RICOH COMPANY, LTD.), in step A1. The PC 12 may send the print data to an output end apparatus (for example, a MFP (Multi-Function Peripheral) 13) via a USB (Universal Serial Bus) or a LAN (Local Area Network), in step A2, in order to output a print of the converted print data from the MFP 13.

According to the cloud printing, the procedure of step A1 is executed in a cloud system 10, in step A4. When viewed from the cloud system 10, the input end apparatus and the output end apparatus becomes clients. These clients communicate with a virtual server 11 in the cloud system 10, in order to perform a predetermined process. Hence, the PC 12 may upload the data to be converted to the cloud system 10 in step A3, and the MFP 13 may retrieve the converted print data, obtained in the cloud system 10 by the data conversion process in step A4, in step A5.

Because the PC 12 does not need to perform the data conversion process of step A2 in the case of the cloud printing, a local client does not require a data conversion engine. However, the data conversion engine provided in the cloud system 10 needs to cope with various types of electronic document files, and the number of types of electronic document files may continue to increase in the future. In addition, the output end apparatus is not limited to the MFP 13, and a projector or a completely unknown apparatus may form the output end apparatus, thus requiring the data conversion engine of the cloud system 10 to cope with the various types of apparatuses that may form the output end apparatus. Further, the data conversion engine of the cloud system 10 may be required to make a conversion to a data format connectable to another cloud service. Hence, one object of this embodiment may be to flexibly cope with the increase in the number of types of data conversion processes.

Figure 2:
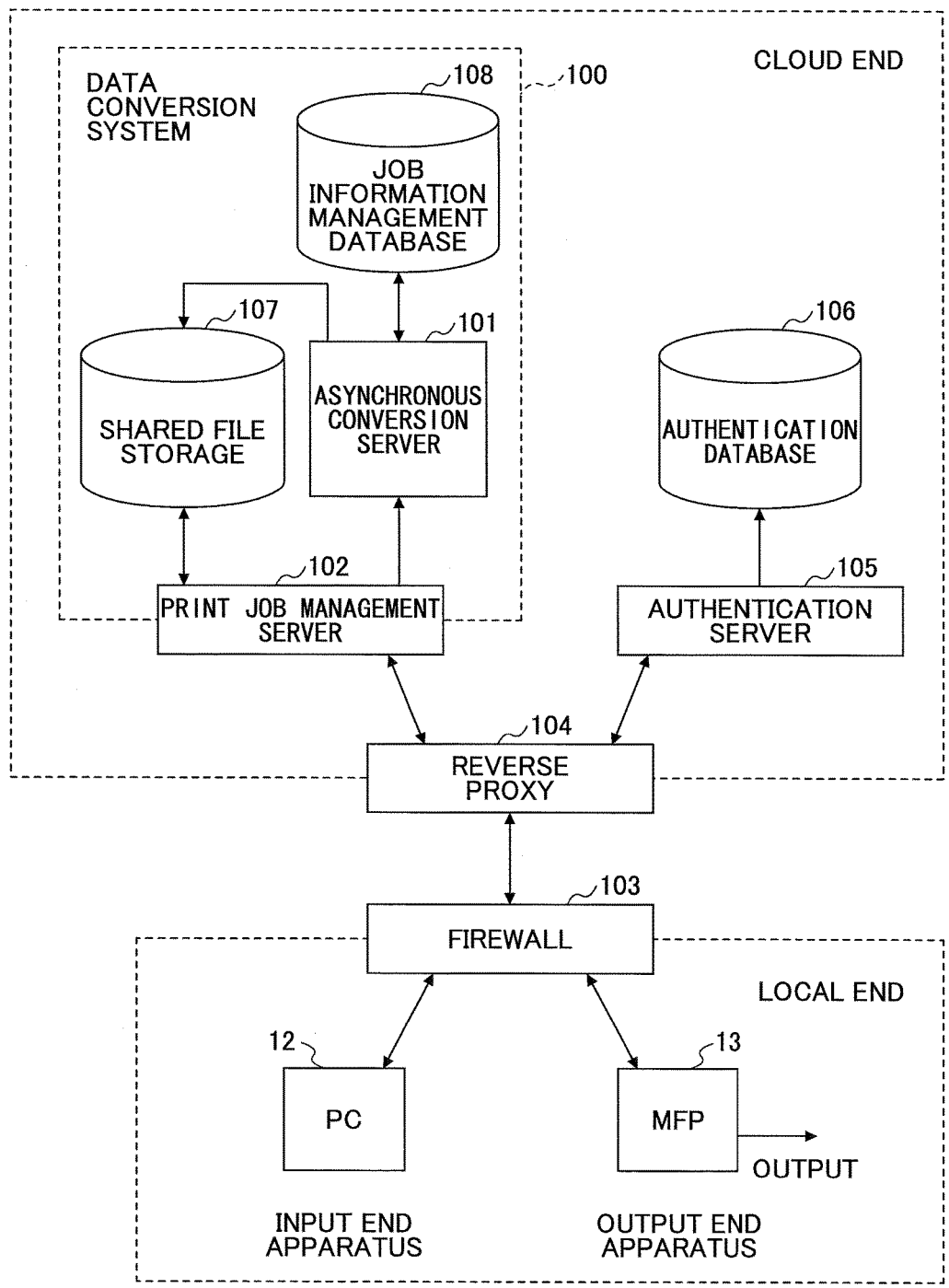
FIG. 2 is a block diagram illustrating an example of a structure of a computer system for realizing the cloud printing.

The cloud printing illustrated in FIG. 1 may be realized by a cloud computing type computer system illustrated in FIG. 2. FIG. 2 is a block diagram illustrating an example of a structure of the computer system for realizing the cloud printing.

In FIG. 2, the local end may include the general purpose PC 12 and the MFP 13. The PC 12 and the MFP 13 may be connected to the Internet via a firewall 103 that is set up in a gateway or the like of the LAN. The PC 12 and the MFP 13 may or may not be located on the same network, and the cloud printing is effective in both cases. In the following description, it is assumed for the sake of convenience that the PC 12 and the MFP 13 are not located on the same network. This is because the advantageous features of the cloud printing may be understood more easily by referring to the case in which the exchange of data between the PC 12 and the MFP 13 at the local end may not necessarily be performed in a simple manner.

In FIG. 2, the cloud end may include a data conversion system 100, a print job management server 102, a reverse proxy 104, an authentication server 105, and an authentication database 106.

Figure 4:
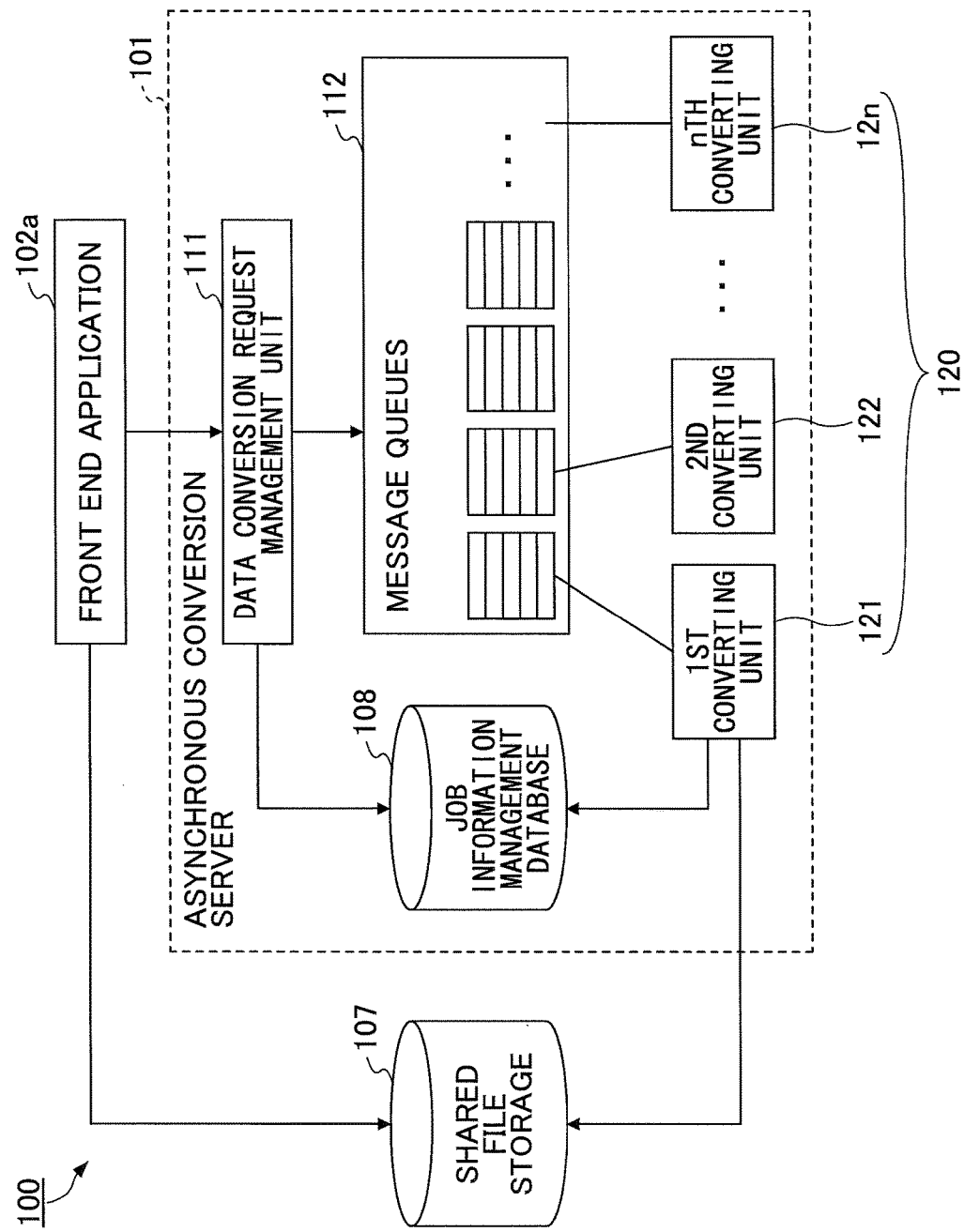
FIG. 4 is a block diagram illustrating a functional structure of an embodiment of the present invention.

The data conversion system 100 may include an asynchronous conversion server 101, a shared file storage 107, and a job information management database 108. The shared file storage 107 may be connected externally to the data conversion system 100. In addition, the job information management database 108 may form a part of the asynchronous conversion server 101, as illustrated in FIG. 4 which will be described later.

The reverse proxy 104 may mediate the communication of the local end apparatus, and thus, the communication or process of the local end apparatus does not need to take into consideration the internal structure and the like of the server group or storage at the cloud end. The authentication server 105 and the authentication database 106 may function to authenticate the user and/or the local end apparatus. The print job management server 102 and the data conversion system 100 may manage and/or register a print job that is uploaded by the local end apparatus, and may send the print data when a print request is received from the local end apparatus.

The print job may include an electronic document file that is created by a work processor application or the like. The data conversion system 100 may convert the electronic document file included in the print job into the print data, that is, electronic data in a data format (PDL: Page Description Language) that may be printed and output from the MFP 13, for example.

Figure 3:
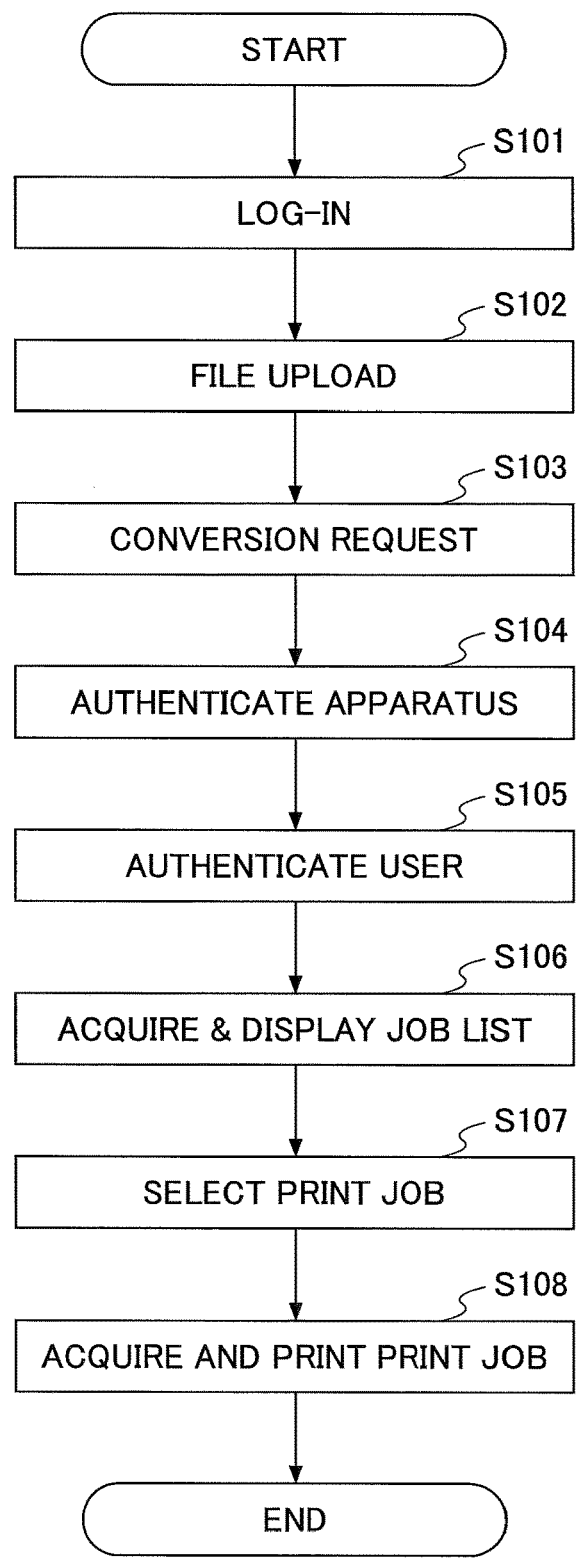
FIG. 3 is a flow chart for explaining an example of a procedure to utilize the computer system illustrated in FIG. 2.

Next, a description will be given of an example of a procedure to utilize the computer system illustrated in FIG. 2, by referring to FIG. 3. FIG. 3 is a flow chart for explaining the example of the procedure to utilize the computer system illustrated in FIG. 2. First, the user makes a log-in to the cloud printing service from the PC 12 (step S101). An authentication process with respect to this log-in may be executed by the authentication server 105.

Next, the user uploads the electronic document file that is to be printed to the cloud printing service, from the PC 12

(step S102). This uploading of the electronic document file may correspond to the registration of the print job. A registration process with respect to this print job may be executed by the print job management server 102. The procedures of steps S101 and S102 are performed by the PC 12.

When the print job is registered, the cloud printing service performs the data conversion in a background process. The print job management server 102 requests the data conversion of the registered electronic document file to the data conversion system 100 (step S103). Details of the process performed in step S103 will be described later.

When making a print output, the user may perform the following series of procedures on the MFP 13. First, the cloud end confirms whether the MFP 13 is capable of accepting the cloud print service, by authenticating the MFP 13 (step S104). Next, the user operates the MFP 13 to make a log-in to the cloud printing service from the MFP 13, in order to authenticate the user (step S105).

After the authentications, the MFP 13 acquires a job list from the cloud printing service, and displays the acquired job list on a display unit (or means) that is not illustrated (step S106). Next, the user selects a desired print job that is to make the print output, from the displayed job list (step S107). When the user selects the print job, the MFP 13 acquires the print job from the cloud printing service and makes the print output (step S108).

As described above, the PC 12 and the MFP 13 may be physically separated. Because the PC 12 and the MFP 13 do not require the printer driver (or data conversion engine) in order to provide the cloud printing service, conference materials may be created and/or updated, for example, and the conference materials may be printed and output during a business trip to a foreign country. Such use of the cloud printing service is only one example of the effective use of the cloud printing service.

(Data Conversion System)

The data conversion system 100 in this embodiment may have the structure described hereunder, in order to cope with the various types of data conversion requests and/or to flexibly cope with the increase in the number of types of data conversion requests. FIG. 4 is a block diagram illustrating a functional structure of an embodiment of the present invention. More particularly, FIG. 4 illustrates the functional structure of the data conversion system 100.

As illustrated in FIG. 4, the data conversion system 100 may include a front end application 102a, a shared file storage 107, and an asynchronous conversion server 101. The front end application 102a may be a function of the print job management server 102. The asynchronous conversion server 101 may provide an asynchronous conversion service. The asynchronous conversion server 101 may include a data conversion request management unit (or means) 111, message queues 112, a job information management database 108, and a plurality of converting units (or means) 120. The plurality of converting units 120 are designated by reference numerals 121, 122, ..., 12n in FIG. 4, where n is a natural number greater than or equal to two (2). The data conversion request management unit 111 may form a control unit (or means).

The print job management server 102 may include a function to receive the print job sent from the input end apparatus, such as the PC 12, and to register the electronic document file or the like included in the print job to the shared file storage 107, in a cloud printing solution described above with reference to FIG. 3. In addition, the print job management server 102 may judge the required file conversion and control the data conversion system 100 to execute the required file conversion.

The converted file may be registered in the shared file storage 107. When an output instruction to output the print job is received from the output end apparatus, such as the MFP 13, the print job management server 102 may send the registered converted file to the MFP 13 that sent the output instruction.

The front end application 102a may include a function to judge the file conversion required to execute the output instruction. In a case in which the registered electronic file is a WORD (registered trademark) document file in conformance with Microsoft WORD (registered trademark) provided by Microsoft Corporation and the MFP 13 that sends the output instruction employs the RPCS, for example, the front end application 102a may judge that the registered electronic file requires conversion from the WORD (registered trademark) document file data format into the RPCS data format.

The front end application 102a may embed the type of data conversion required, as a parameter such as type="doc2rpcs", for example, in the data conversion request that is sent to the asynchronous conversion server 101. Similarly, a parameter such as a URI (Uniform Resource Indicator) of the data (or source data) before the conversion may be embedded in the data conversion request. The URI is information indicating a location where the data exists in the shared file storage 107.

In the asynchronous conversion server 101 that receives the data conversion request embedded with the type of data conversion and the URI of the data, the data conversion request management unit 111 may receive this data conversion request. The data conversion request management unit 111 may analyze the data conversion request, and insert a message in a queue of the message queues 112 that matches the type of data conversion.

The data conversion request management unit 111 may register or update the information of the data conversion request in the job information management database 108, simultaneously as, that is, in parallel to, the insertion of the message to queue of the message queues 112.

The information registered in the job information management database 108 may include the location of the file (URI in the shared file storage 107), the type of data conversion included in the data conversion request, a state of the data conversion request, and the like. The state of the data conversion request may include "executing data conversion", "converting data", "data conversion completed", and the like. The state of the data conversion request may represent a status or a processing state of the data conversion.

The message queues 112 may include queues corresponding to each of the plurality of converting units 120. FIG. 4 illustrates an example in which each converting unit 120 and each queue of the message queues 112 correspond 1:1, however, two or more converting units 120 may correspond to two or more queues of the message queues 112. In other words, the correspondence between the converting units 120 and the queues of the message queues 112 may be one-to-one or many-to-many.

Each converting unit 120 may monitor the corresponding queue of the message queues 112. When the message is inserted into the corresponding queue, the converting unit 120 may acquire the registered information of the data conversion request corresponding to the message from the job information management database 108. Each converting unit 120 may acquire the data in the shared file storage 107, based on the URI included in the information of the data conversion request acquired from the job information management database 108.

In addition, each converting unit 120 may convert the acquired data. Each converting unit 120 may register the converted data in the shared file storage 107, and rewrite and update the registered information of the data conversion request in the job information management database 108. In addition, the when the converting units 120 are coordinated or linked to perform the data conversion, each converting unit 120 after performing the data conversion may insert a new message into the queue of the message queues 112 corresponding to the converting unit 120 that is to next perform the data conversion.

Figure 5:
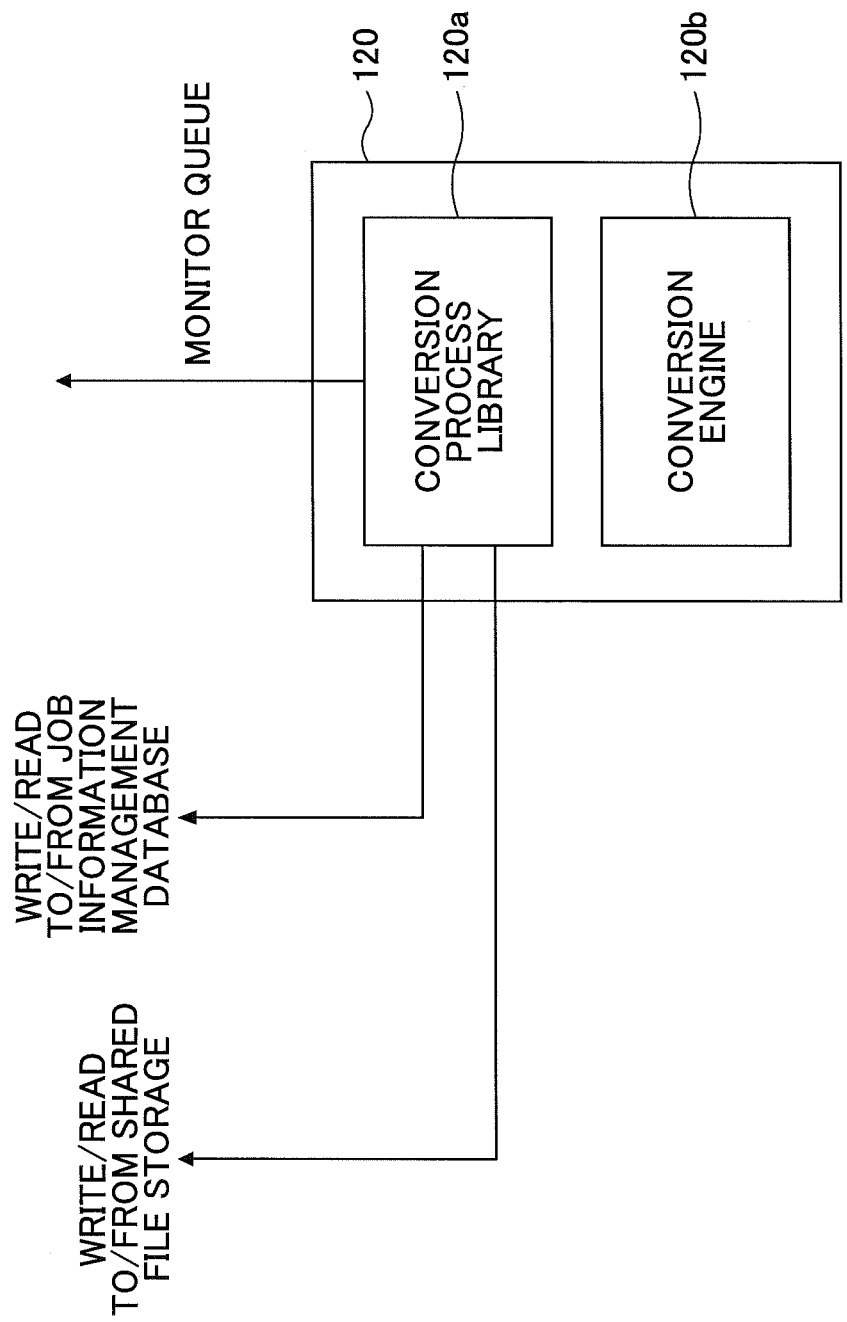
FIG. 5 is a block diagram illustrating a detailed structure of a converting unit (or means) illustrated in FIG. 4.

FIG. 5 is a block diagram illustrating a detailed structure of the converting unit 120 illustrated in FIG. 4. As illustrated in FIG. 5, the plurality of converting unit 120 may include a conversion process library 120a and a conversion engine 120b. The conversion process library 120a may execute a process to monitor a queue of the message queues 112 corresponding to the converting unit 120 to which the conversion process library 120a belongs, a process to register the converted data in the shared file storage 107, a process to rewrite and update the information of the data conversion request registered in the job information management database 108, a process to insert the new message into the queue of the message queues 112 corresponding to the converting unit 120 that is to next perform the data conversion after the data conversion when the plurality of converting units 120 are coordinated or linked to perform the data conversion, and the like.

For example, the conversion engine 120b may include the following.

"office2rpcs": An engine to convert an electronic document file created by Microsoft OFFICE (registered trademark) provided by Microsoft Corporation into RPCS;

"pdf2rpcs": An engine to convert PDF (Portable Document Format) into RPCS;

"img2pdf": An engine to convert an image file into PDF; and

"html2pdf": An engine to convert a page file in HTML (Hyper Text Markup Language) into PDF.

(Asynchronous Conversion Service)

Figure 6:
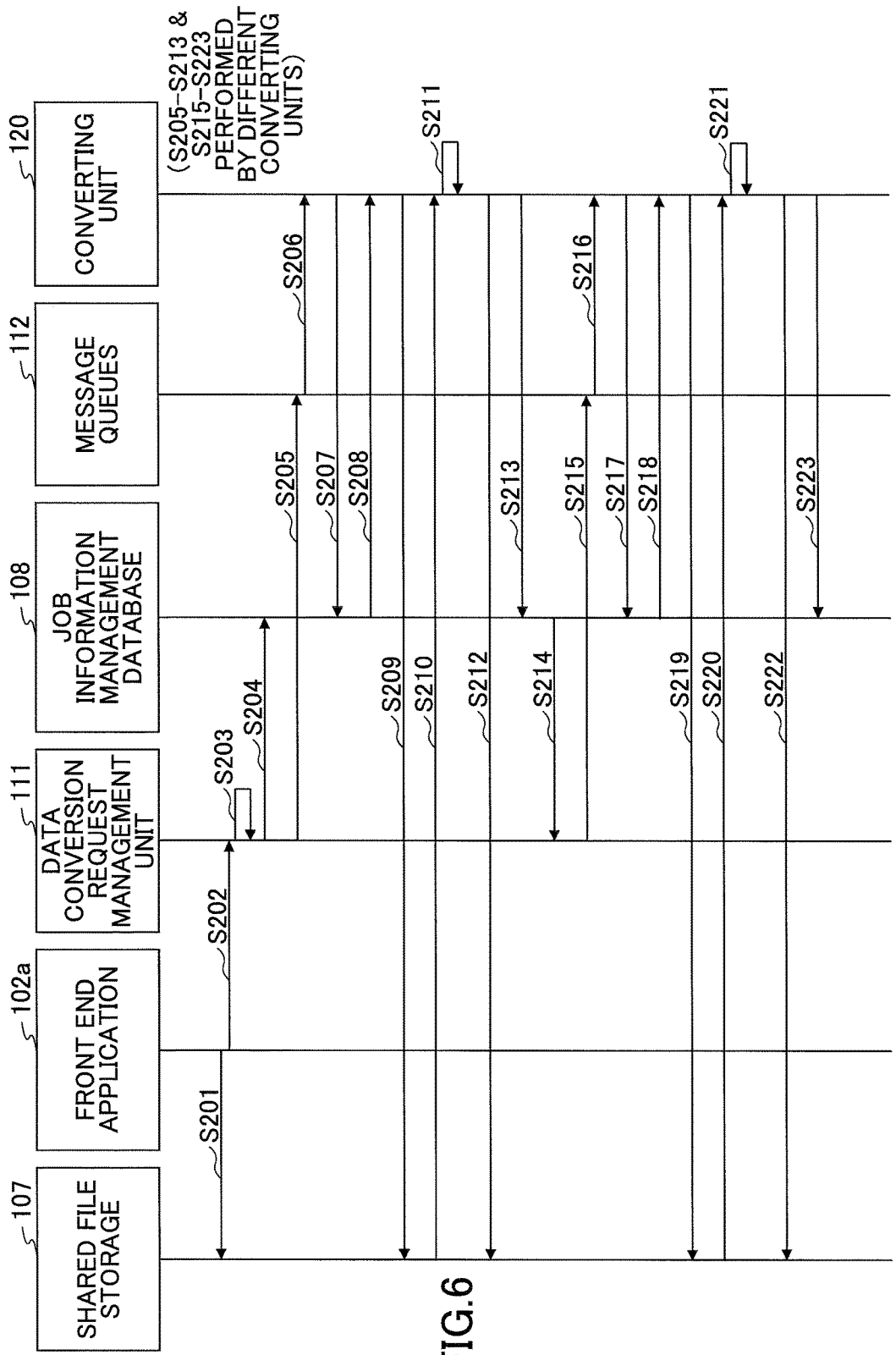
FIG. 6 is a timing chart for explaining an operation of an asynchronous conversion server illustrated in FIG. 4.

Next, a description will be given of the asynchronous conversion service provided by the asynchronous conversion server 101 illustrated in FIG. 4, by referring to FIG. 6. FIG. 6 is a timing chart for explaining an operation of the asynchronous conversion server 101 illustrated in FIG. 4.

The asynchronous conversion service may be started when the front end application 102a sends (step S202) a data conversion request with respect to data registered (step S201) in the shared file storage 107, to the data conversion request management unit 111 forming the data conversion system 100.

The data conversion request sent in step S202 may be embedded with the type of data conversion judged by the front end application 102a, as the parameter such as type="doc2rpcs", for example. In addition, the data conversion request may also be embedded with the parameter such as the URI of the data to be converted.

The data conversion request management unit 111 may analyze the data conversion request that is received, in order to judge whether there is a conversion engine 120b that matches the type of data conversion (step S203). When there is a conversion engine 120b that matches the type of data conversion, the message may be inserted into the queue of the message queues 112 corresponding to the type of data conversion.

On the other hand, where there is no conversion engine 120b that matches the type of data conversion, the plurality of conversion engines 120b (of the plurality of converting units 120) may be coordinated or linked, in order to judge a combination of the conversion engines 120b that may perform the desired type of data conversion. In addition, the message is inserted into the queue of the message queues 112 corresponding to the first type of data conversion.

In the example illustrated in FIG. 6, a case may be considered in which there is no conversion engine 120b that matches the type of data conversion, but the desired type of data conversion may be performed by coordinating or linking two conversion engines 120b.

Figure 7:
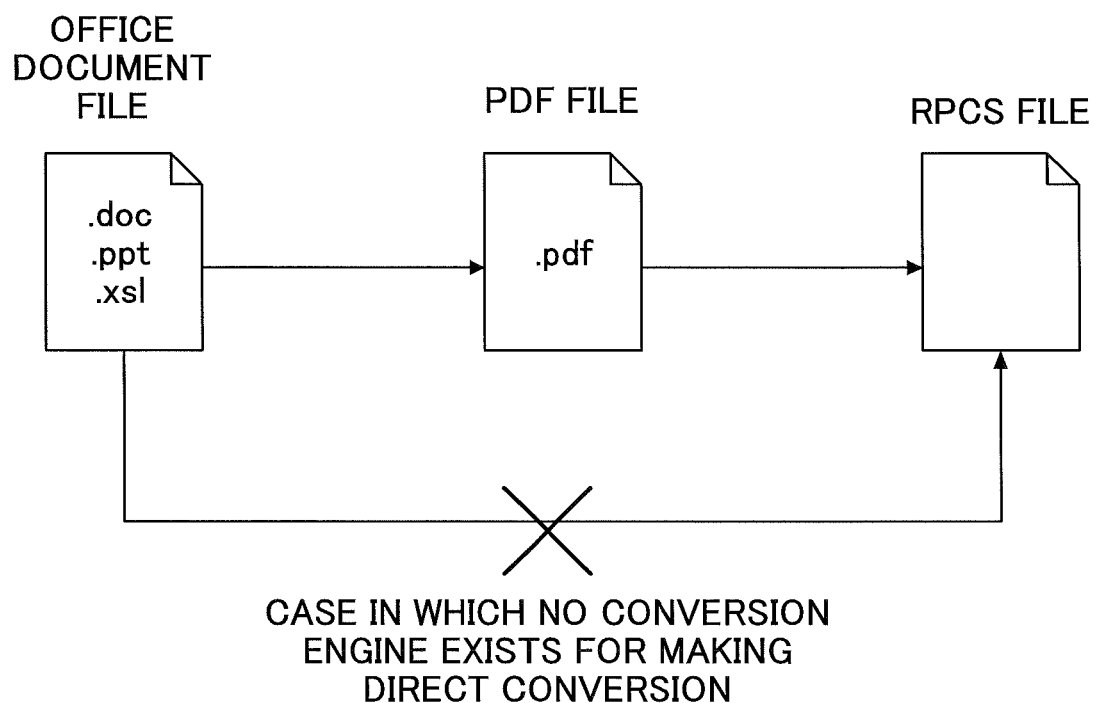
FIG. 7 is a diagram schematically illustrating an example of a data transition in FIG. 6.

In this case, when there is no "office2rpcs" but there are "office2pdf" and "pdf2rpcs" that may be coordinated or linked as illustrated in FIG. 7, the data conversion may be performed to convert the OFFICE document (OFFICE document file) into the document in a PDL such as RPCS (RPCS file). FIG. 7 is a diagram schematically illustrating an example of a data transition in FIG. 6.

The data conversion request management unit 111 may register the information of the data conversion request in the job information management database 108 (step S204). In addition, the data conversion request management unit 111 may insert the message into the queue of the message queues 112 (step S205).

Each converting unit 120 may monitor the corresponding queue of the message queues 112. When the converting unit 120 monitoring the corresponding queue of the message queues 112 detects that the message is inserted into the corresponding queue (step S206), the converting unit 120 may acquire the information of the registered data conversion request corresponding to the message from the job information management database 108 (steps S207 and S208). Based on the URI included in the information of the acquired data conversion request, the converting unit 120 may acquire the data in the shared file storage 107 (steps S209 and S210). Then, the converting unit 120 may convert the acquired data (step S211).

Each converting unit 120 may register or update the converted data in the shared file storage 107 (step S212). At the same time, each converting unit 120 may update the information of the data conversion request registered in the job information management database 108 in order to indicate that the conversion has been made (step S213). By this updating of the information of the data conversion request, the state of the data conversion request may be updated to "converting data".

The data conversion request management unit 111 may monitor the updating of the job information management database 108. When the data conversion request management unit 111 detects the end of a first stage of the data conversion process that is divided into two stages in step 203 (step S214), the data conversion request management unit 111 may generate a message of the second stage of the data conversion process and insert the generated message in the queue of the message queues 112 (step S215).

Each converting unit 120 may be configured to directly insert the queue to the message queues 112. In this case, the converting unit (or the conversion process library 120a) after the data conversion therein may execute a process to insert a new request to the queue of the converting unit 120 that is to next perform the data conversion.

When the converting unit 120 monitoring the corresponding queue of the message queues 112 detects that the message is inserted into the corresponding queue (step S216), the converting unit 120 may acquire the information of the registered data conversion request corresponding to the message from the job information management database 108 (steps S217 and S218). Based on the URI included in the information of the acquired data conversion request, the converting unit 120 may acquire the data in the shared file storage 107 (steps S219 and S220). Then, the converting unit 120 may convert the acquired data (step S221).

Each converting unit 120 may register or update the converted data in the shared file storage 107 (step S222). At the same time, each converting unit 120 may update the information of the data conversion request registered in the job information management database 108 in order to indicate that the conversion has been made (step S223). By this updating of the information of the data conversion request, the state of the data conversion request may be updated to "data conversion completed".

Processes of steps S215 through S223 are similar to the processes of steps S205 through S213, except that the processes are performed by different converting units 120 (for example, by the first converting unit 121 and the second converting unit 122), except for a case in which the same data conversion is performed in duplicate.

By carrying out the operation described above, the example illustrated in FIG. 6 may process the data conversion request illustrated in FIG. 7 for which the conversion engine 120b for making the direction conversion is not provided, by suitably combining a plurality of existing conversion engines 120b to coordinate or link the existing conversion engines 120b, without having to prepare or provide the conversion engine 120b that satisfies the data conversion request.

The number of types of the data conversion request may increase after the data conversion system 100 is started. However, this embodiment may flexibly cope with such an increase in the number of types of the data conversion request.

The types of the conversion engine 120b are of course not limited to those of the above described embodiments. For example, the types of the conversion engine 120b may include a converting unit or means to convert bar code image data into character string data, a converting unit or means to convert image file data into character string data by reading the image file data by an OCR (Optical Character Reader), and the like.

Second Embodiment

A second embodiment of the present invention may also flexibly cope with the increase in the number of types of data conversion processes.

<System Structure>

Figure 8:
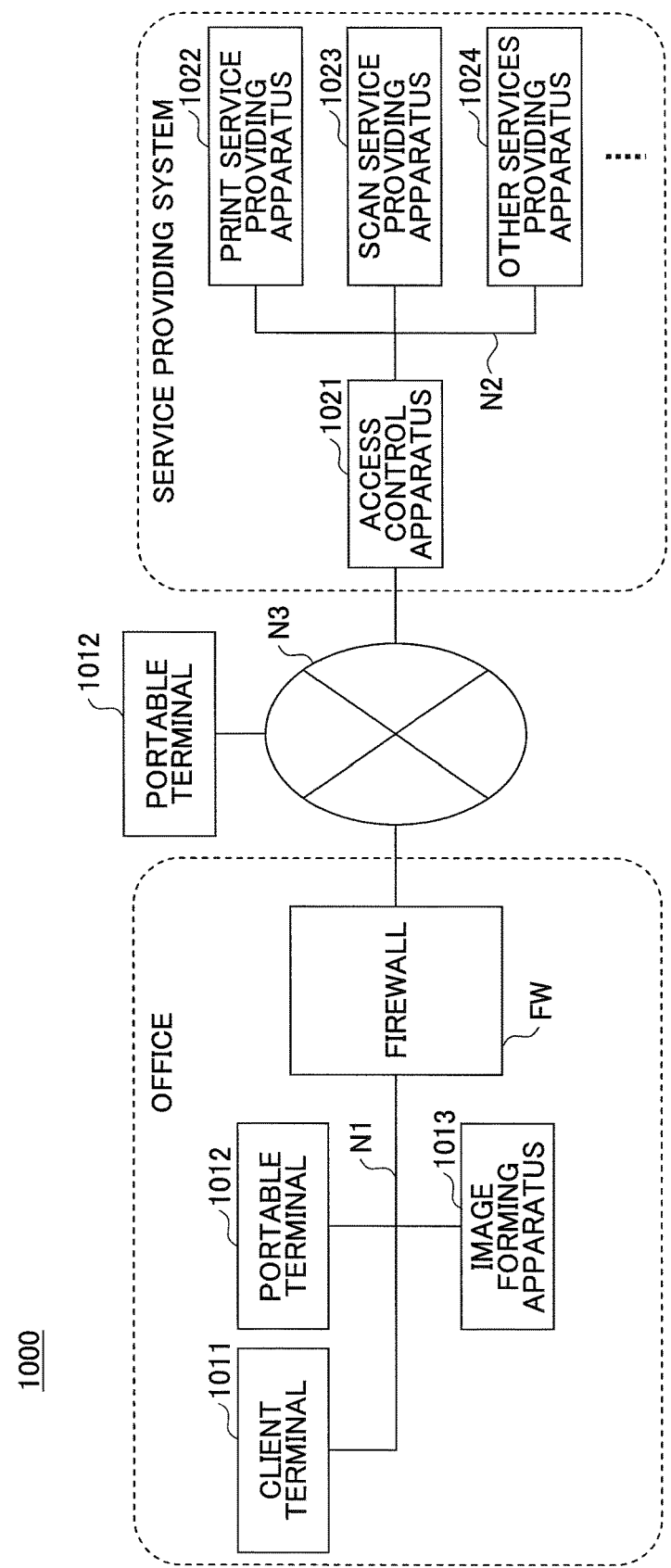
FIG. 8 is a diagram illustrating an example of a structure of a system in a second embodiment.

FIG. 8 is a diagram illustrating an example of a structure of a system in the second embodiment. For example, a system 1000 illustrated in FIG. 8 may include a network N1 that may be a network or the like within an office, a network N2 that may be a service providing system typified by a cloud service, and a network N3 that may be the Internet or the like.

The network N1 may be a private network on the inner side of a firewall FW. The firewall FW may be set up at a node between the network N1 and the network N3, in order to detect and block unauthorized access. A client terminal 1011, portable terminals 1012, and an image forming apparatus 1013 such as a MFP may be connected to the network N1.

The client terminal 1011 is an example of a terminal apparatus. The client terminal 1011 may be formed by an information processing apparatus installed with a general OS (Operating System). The client terminal 1011 may include a communication unit or means to communicate via a cable or to make a wireless communication. The client terminal 1011 may be formed by a tablet PC (Personal Computer), a lap-top PC, and the like that may be operated by the user.

The portable terminal 1012 is an example of the terminal apparatus. The portable terminal 1012 may include a communication unit or means to communicate via a cable or to make a wireless communication. The portable terminal 1012 may be formed by a mobile (or cellular) phone such as a smart phone, a tablet PC, a lap-top PC, and the like that may be carried by the user.

The image forming apparatus 1013 is an example of an apparatus such as a MFP having an image forming function. The image forming apparatus 1013 may include a communication unit or means to communicate via a cable or to make a wireless communication. The image forming apparatus 1013 may be formed by an apparatus that performs a process related to image formation, such as the MFP, a copying machine, a scanner, a printer, a laser printer, a projector, an electronic blackboard, and the like. In the example illustrated in FIG. 8, one client terminal 1011, one portable terminal 1012, and one image forming apparatus 1013 are provided in the network N1, however, a plurality of client terminals 1011 and/or a plurality of portable terminals 1012, and/or a plurality of image forming apparatuses 1013 may be provided in the network N1.

The client terminal 1011 and the portable terminal 1012 may correspond to the PC 12 of the first embodiment. The image forming apparatus 1013 may correspond to the MFP 13 of the first embodiment.

The network N2 may be connected to the network N3 via an access control apparatus 1021. The security of the network N2 may be protected by the access control apparatus 1021. A print service providing apparatus 1022, a scan service providing apparatus 1023, and an other services providing apparatus 1024 may be connected to the network N2.

In the system 1000 illustrated in FIG. 8, the access control apparatus 1021, the print service providing apparatus 1022, the scan service providing apparatus 1023, and the other services providing apparatus 1024 may form a service providing system. This service providing system may correspond to the data conversion system 100, the print job management server 102, the reverse proxy 104, the authentication server 105, and the authentication database 106 of the first embodiment.

The access control apparatus 1021 may control the log-in to a print service provided by the print service providing apparatus 1022 and a scan service provided by the scan service providing apparatus 1023.

Each of the access control apparatus 1021, the print service providing apparatus 1022, the scan service providing apparatus 1023, and other services providing apparatus 1024 may be formed by one or more information processing apparatuses.

The access control apparatus 1021, the print service providing apparatus 1022, the scan service providing apparatus 1023, and other services providing apparatus 1024 may be integrated into a single information processing apparatus.

Alternatively, functions of the access control apparatus 1021, the print service providing apparatus 1022, the scan service providing apparatus 1023, and other services providing apparatus 1024 may be realized by distributed processing by a plurality of information processing apparatus.

A part of the services on the side of the network N2 may be provided at a location other than the network N2. The portable terminal 1012 may be provided in a network other than the network N1, such as the network within the office. In the system 1000 illustrated in FIG. 8, the portable terminal 1012 is provided in the network N1 and in the network N3.

<Hardware Structure>

Figure 9:
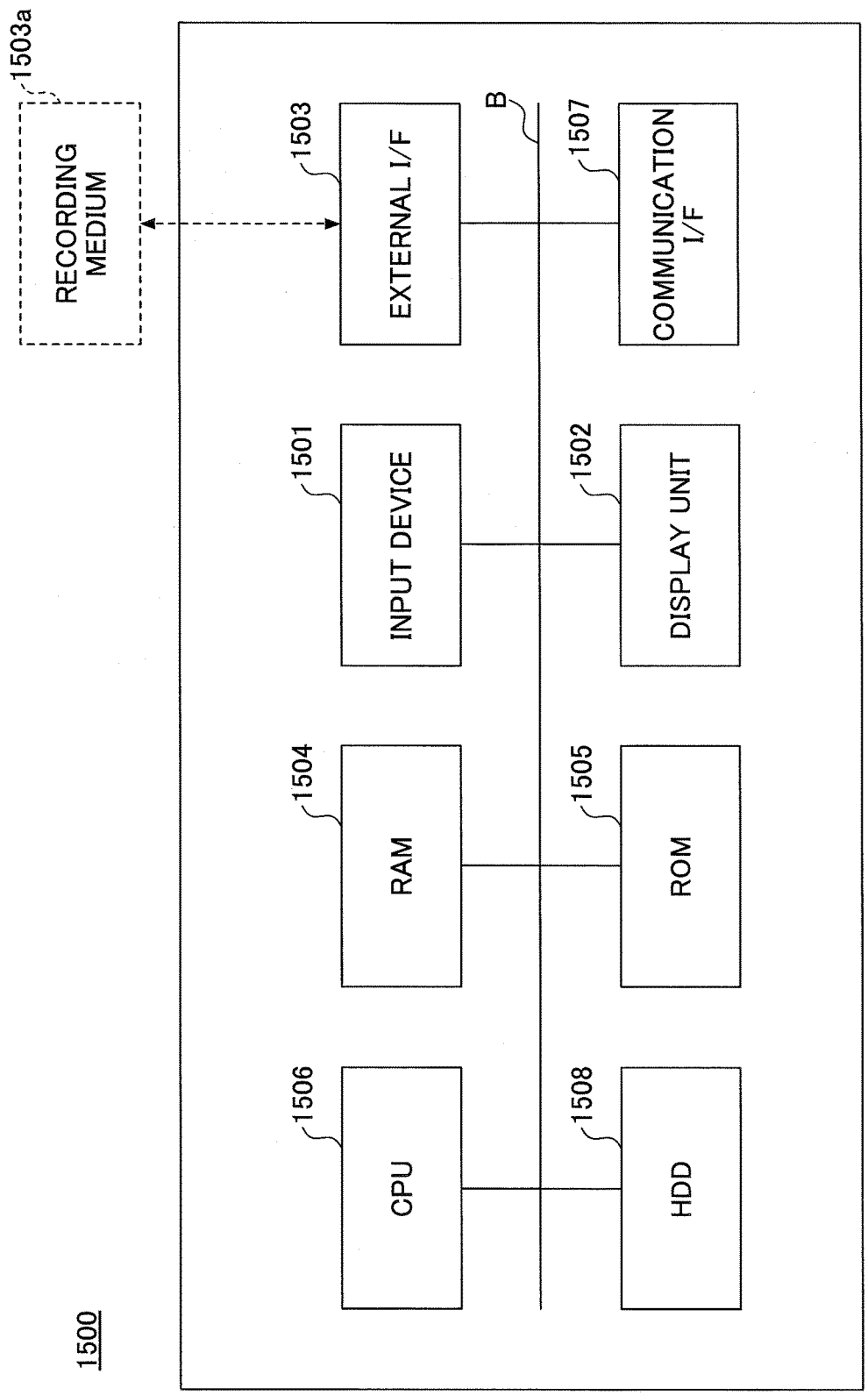
FIG. 9 is a diagram illustrating an example of a hardware structure of a computer system.

Each of the client terminal 1011, the portable terminal 1012, the access control apparatus 1021, the print service providing apparatus 1022, the scan service providing apparatus 1023, and the other services providing apparatus 1024 may be formed by a computer system having a hardware structure illustrated in FIG. 9, for example.

FIG. 9 is a diagram illustrating an example of the hardware structure of the computer system. A computer system 1500 illustrated in FIG. 9 may include an input device 1501, a display unit 1502, an external interface (I/F) 1503, a RAM (Random Access Memory) 1504, a ROM (Read Only Memory) 1505, a CPU (Central Processing Unit) 1506, a communication I/F 1507, and a HDD (Hard Disk Drive) 1508, and the like that are mutually connected via a bus B.

The input device 1501 may include a keyboard, a mouse, a touchscreen panel, and the like. The input device 1501 may be operated by the user to input various operation signals to the computer system 1500. The display unit 1502 may include a display, and the like, and displays processed results and the like of the computer system 1500.

The communication I/F 1507 provides an interface to connect the computer system 1500 to the networks N1 through N3. Hence, the computer system 1500 may perform a data communication via the communication I/F 1507.

The HDD 1508 is an example of a nonvolatile storage unit to store programs and data. The programs and data stored in the HDD 1508 may include the OS, that is the basic software controlling the entire computer system 1500, and application software to provide various functions on the OS, for example.

The HDD 1508 may manage the programs and data stored therein in a predetermined file system and/or a database (DB). The external I/F 1503 provides an interface between the computer system 1500 and an external apparatus. The external apparatus may include a recording medium (or storage medium) 1503a. Hence, the computer system 1500 may perform a read and/or a write with respect to the recording medium 1503a via the external I/F 1503. The recording medium 1503a may be formed by a flexible disk, a CD (Compact Disk), a DVD (Digital Versatile Disk), a SD (Secure Digital) memory card, a USB (Universal Serial Bus) memory, and the like.

The ROM 1505 is an example of a nonvolatile semiconductor memory (or memory device) capable of storing programs and data even when the power thereto is turned OFF. The ROM 1505 may store programs and data including a BIOS (Basic Input/Output System) that is executed when starting the computer system 1500, OS settings, network settings, and the like. The RAM 1504 is an example of a volatile semiconductor memory (or memory device) capable of temporarily storing programs and data.

The CPU 1506 is an example of a computing unit that may realize various controls and functions of the entire computer system 1500, by reading the programs and data from the storage device or unit, such as the ROM 1505 and the HDD 1508, into the RAM 1504, and executing the programs to perform processes of the controls and/or the functions.

The client terminal 1011, the portable terminal 1012, the access control apparatus 1021, the print service providing apparatus 1022, the scan service providing apparatus 1023, and the other services providing apparatus 1024 may realize the various processes to be described hereunder, by the hardware structure of the computer system 1500 described above.

<Software Structure>

<<Service Providing System>>

Figure 10:
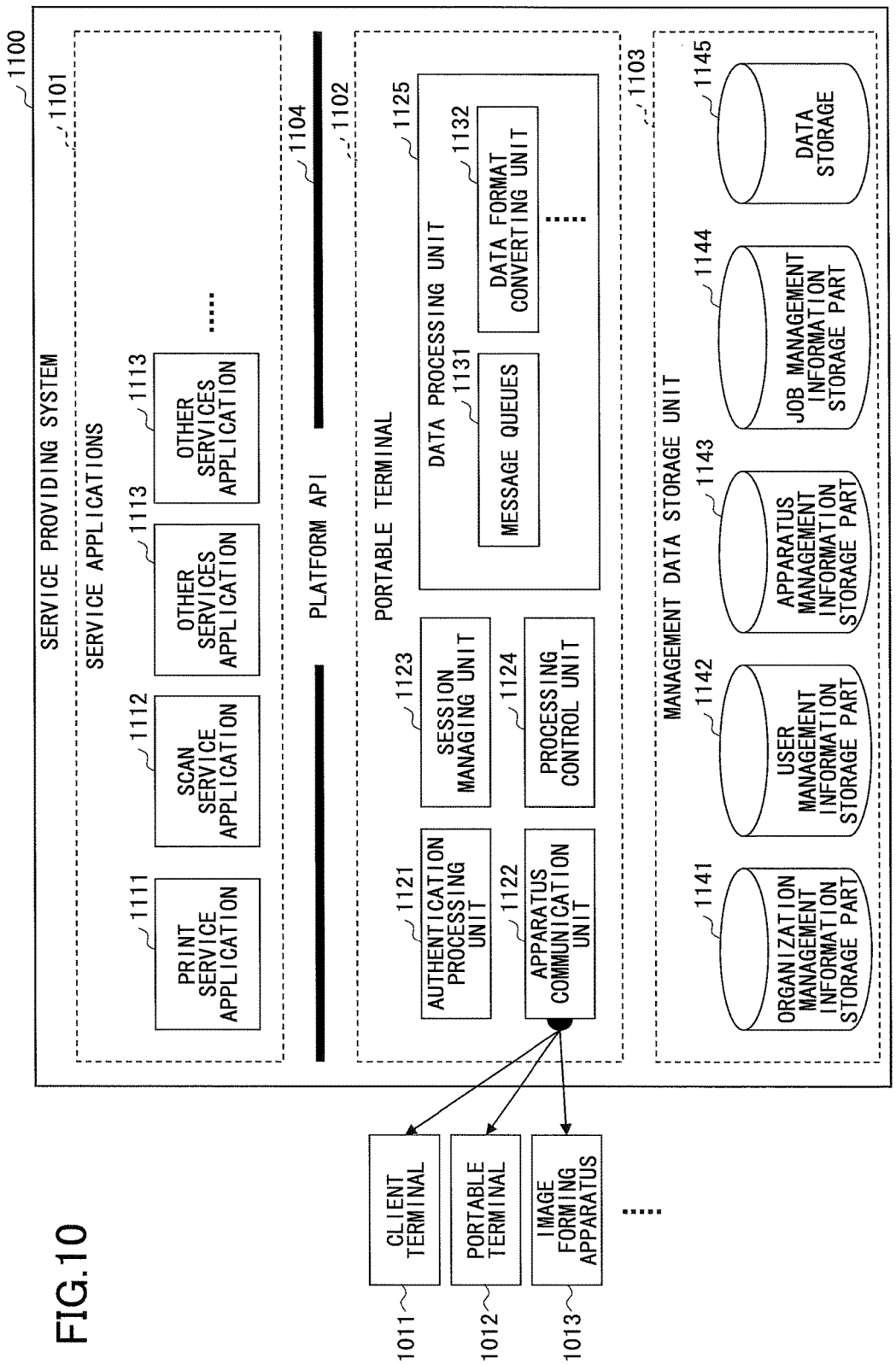
FIG. 10 is a block diagram illustrating an example of a service providing system in the second embodiment.

The service providing system in this second embodiment may be realized by a structure illustrated in FIG. 10. FIG. 10 is a block diagram illustrating an example of the service providing system in this second embodiment.

A service providing system 1100 illustrated in FIG. 10 may realize service applications 1101, a platform 1102, a management data storage unit 1103, and a platform API (Application Programming Interface) 1104 by executing one or more programs.

The service applications 1101 may include a print service application 1111, a scan service application 1112, one or more other service applications 1113, for example. The print service application 1111 may provide a print service. The scan service application 1112 may provide a scan service. The other services application 1113 may provide other services.

The platform API 1104 may provide an interface to enable the service applications 1101, such as the print service application 1111, the scan service application 1112, and the other services application 113, to utilize the platform 1102. The platform API 1104 may be a predefined interface that is provided for the platform 1102 to receive the request from the service application 1101, and may be formed by a function, class, and the like, for example. When forming the service providing system 1100 by the distributed processing of a plurality of information processing apparatuses, the platform API 1104 may be formed by a Web API, for example, that may be utilized via the network.

The platform 1102 may include an authentication processing unit 1121, an apparatus communication unit 1122, a session managing unit 1123, a processing control unit 1124, and a data processing unit 1125. The data processing unit 1125 may include message queues 1131, and one or more data format converting units 1132. The data format converting unit 1132 may form a control unit (or means).

The authentication processing unit 1121 corresponds to the authentication server 105 of the first embodiment. The authentication processing unit 1121 may execute an authentication based on a log-in request from an office apparatus, such as the client terminal 1011 and the image forming apparatus 1013. The office apparatus may be a generic name for the client terminal 1011, the portable terminal 1012, the image forming apparatus 1013, and the like. The authentication processing unit 1121 may authenticate the user by making access to a user management information storage part 1142. In addition, the authentication processing unit 1121 may authenticate the image forming apparatus 1013 and the like, by making access to an organization management information storage part 1141 and an apparatus management information storage part 1143.

The apparatus communication unit 1122 may execute a communication with the office apparatus. The session managing unit 1123 may manage a session with the office apparatus. The processing control unit 1124 may control the data processing executed by the data processing unit 1125 based on the request from the service application 1101. The data processing unit 1125 may execute the data processing under the control of the processing control unit 1124. The processing control unit 1124 may correspond to the data conversion request management unit 111 of the first embodiment. The message queues 1131 of the data processing unit 112 may correspond to the message queues 112 of the first embodiment. The data format converting unit 1132 may correspond to the converting unit 120 of the first embodiment.

The message queues 1131 may include the queues corresponding to the types of the data conversions which will be described later, and may be inserted with the message of the request related to the data conversion and received from the processing control unit 1124. The data format converting unit 1132 may perform the data conversion, segmenting of the data conversion request, and the like when the message is inserted into the queue of the message queues 1131. Details of the process of the asynchronous conversion service in this second embodiment will be described later.

The management data storage unit 1103 may include the organization management information storage part 1141, the user management information storage part 1142, the apparatus management information storage part 1143, a job management information storage part 1144, and a data storage 1145.

The organization management information storage part 1141 may store organization management information which will be described later. The user management information storage part 1142 may store user management information which will be described later. The apparatus management information storage part 1143 may store apparatus management information which will be described later. The organization management information storage part 1141, the user management information storage part 1142, and the apparatus management information storage part 1143 may correspond to the authentication database 106 of the first embodiment.

The job management information storage part 1144 may correspond to the job information management database 108 of the first embodiment, and store the information of the data conversion request. The data storage 1145 may correspond to the shared file storage 107 of the first embodiment, and store the data included in the print job, such as the electronic document data and the like.

The service providing system 1100 may function as a cloud base (or cloud) that includes functions such as authentication and data format conversion, and a service group that provides services such as the print service by utilizing the functions of the cloud base. For example, the cloud base may be formed by the platform 1102, the management data storage unit 1103, and the platform API 1104. For example, the service group may be formed by the service applications 1101.

The authentication function of the cloud base of the service providing system 1100 may be formed by the authentication processing unit 1121 and the authentication database, for example. The authentication database may be formed by, the organization management information storage part 1141, the user management information storage part 1142, the apparatus management information storage part 1143, and the like. The data format conversion function of the cloud base of the service providing system 1100 may be formed by the data processing unit 1125, the job management information storage part 1144, the data storage 1145, and the like.

The service group may provide the services by utilizing the authentication and data format conversion functions of the cloud base of the service providing system 1100.

In addition, the service providing system 1100 illustrated in FIG. 10 may manage the organization management information, the user management information, and the apparatus management information that are utilized in common or shared among the plurality of service applications 1101, as management data, in order to aggregate the authentication function.

<<Management Data>>

FIG. 11 is a diagram illustrating an example of a structure of the organization management information. The organization management information illustrated in FIG. 11 may include, as data items, an organization code, an organization name, a country, a language, address information, and the like. The organization name may be the same of the organization. The country may be a name of the country to which the organization belongs. The language may be the language used by the organization. The address information may indicate a mail address of the organization.

FIG. 12 is a diagram illustrating an example of a structure of the user management information. The user management information illustrated in FIG. 12 may include, as data items, the organization code, a user name, a password, address information, and the like. The user name and the password may be information specifying the user. Accordingly, the user name may be a user ID or the like. In addition, the password is not essential. The user name and the password managed under the same organization code are unique, however, the user name and the password may overlap when the organization codes differ. The address information indicates a mail address of the user, for example.

Furthermore, information to identify an electronic medium (for example, IC card) carried by the user may be used as the user ID. The electronic medium carried by the user is not limited to the IC card, and may be a mobile (or cellular) phone, a tablet terminal, an electronic book terminal, and the like. The information to identify the electronic medium may be a card ID, a serial ID, a telephone number of the mobile (or cellular) phone, profile information of the terminal, and the like. A combination of two or more information may be used to identify the electronic medium.

FIG. 13 is a diagram illustrating an example of a structure of the apparatus management information. The apparatus management information illustrated in FIG. 13 may include the organization code, device authentication information, office information, capability, and the like. The device authentication information may be used for device authentication to judge whether the office apparatus satisfies predetermined conditions. The device authentication information may be an ID indicating that the office apparatus is installed with a predetermined application, an apparatus number indicating a predetermined office apparatus, and the like. The office information may indicate an office in which the office apparatus is set up, for example. The capability may indicate the capability or capacity of the office apparatus, for example.

<Details of Process>

Next, a description will be given of details of the process performed by the service providing system 1100 in this second embodiment. A description of those parts that are similar to those corresponding parts of the first embodiment will be omitted.

<<Data Conversion Process>>

Figure 14:
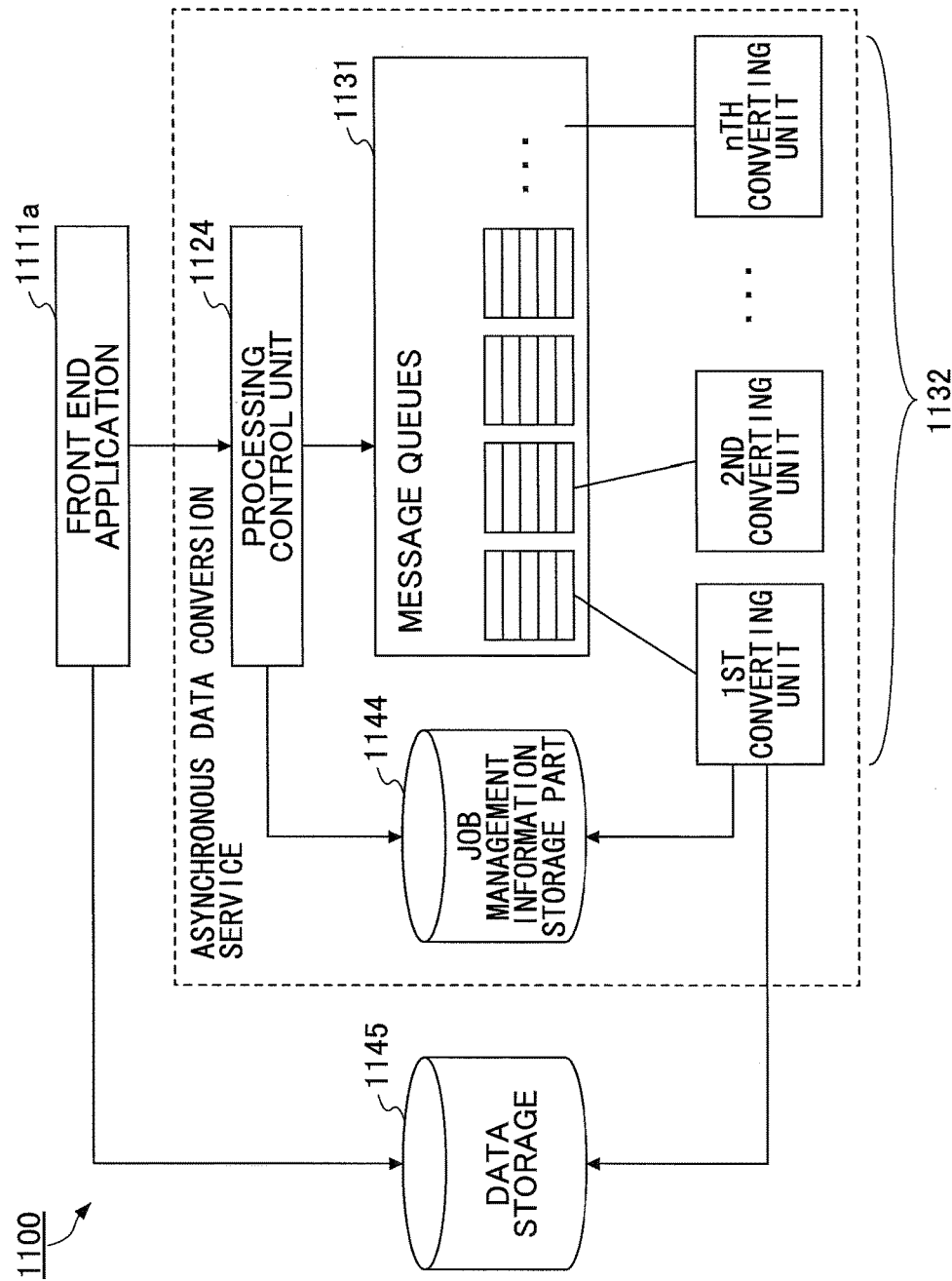
FIG. 14 is a diagram for explaining an example of a data conversion process in the second embodiment.

The service providing system 1100 of this second embodiment may include the following structure, in order to cope with the various types of data conversion requests and to flexibly cope with the increase in the number of types of the data conversion request. FIG. 14 is a diagram for explaining an example of the data conversion process in the second embodiment. FIG. 14 illustrates a functional structure of the service providing system 1100 in which the data conversion process is performed. In FIG. 14, those parts that are the same as those corresponding parts in FIG. 4 are designated by the same reference numerals, and a description thereof will be omitted.

As illustrated in FIG. 14, the service providing system 1100 may include a front end application 111a that is a function of the print service application 111, a data storage 1145, a processing control unit 1124, message queues 1131, a job management information storage part 1144, and a plurality of data format converting units 1132.

The processing control unit 1124, the message queues 1131, the job management information storage part 1144, and the plurality of data format converting units 1132 may provide asynchronous data conversion services. In the cloud print solution, the front end application 1111a may include functions to receive a print job from the input end apparatus, such as the client terminal 1011, and to register the electronic document file and the like included in the print job to the data storage 1145. The front end application 1111a may judge the required file conversion, and control the asynchronous data conversion services to execute the data conversion.

The converted file may be registered in the data storage 1145. When an output instruction of the print job is received from the output end apparatus such as the image forming apparatus 1013, the print service application 1111 may send the converted file registered in the data storage 1145 to the image forming apparatus 1013 that sent the output instruction.

The front end application 1111a may include a function to judge the file conversion required to execute the output instruction. The front end application 1111a may embed the type of data conversion required, as a parameter such as "office2rpcs", for example, in the data conversion request that is sent to the processing control unit 1124. Similarly, the front end application 1111a may also embed the URI of the data at before the conversion, as a parameter indicating the location where the data before the conversion exists.

The processing control unit 1124 may receive the data conversion request at least including the type of data conversion and the URI of the data. The processing control unit 1124 may analyze the data conversion request, and insert a message to a queue of the message queues 1131 matching the type of data conversion.

The process control unit 1124 may register the information of the data conversion request in the job management information storage part 1144, simultaneously as, that is, in parallel to, the insertion of the message to queue of the message queues 1131. The information registered in the job management information storage part 1144 may include the location of the file (URI in the data storage 1145), the type of data conversion included in the data conversion request, the state of the data conversion request, and the like. The state of the data conversion request may include "accept", "executing", "completed", and the like. The state of the data conversion request may represent a status or a processing state of the data conversion.

The message queues 1131 may include queues corresponding to each of the plurality of data format converting units 1132. FIG. 14 illustrates an example in which each data format converting unit 1132 and each queue of the message queues 1131 correspond 1:1, however, two or more data format converting units 1132 may correspond to two or more queues of the message queue 1131. In other words, the correspondence between the data format converting units 1132 and the queues of the message queue 1131 may be one-to-one or many-to-many.

Each data format converting unit 1132 may monitor the corresponding queue of the message queues 1131. When the message is inserted into the corresponding queue, the data format converting unit 1132 may perform processes such as the data conversion corresponding to the message, the segmenting of the data conversion request corresponding to the message, and the like.

For example, when performing the data conversion process, the data format converting unit 1132 may acquire the data in the data storage 1145, based on the URI of the data included in the message, and convert the acquired data. The data format converting unit 1132 may register the converted data in the data storage 1145, and update the information of the data conversion request registered in the job management information storage part 1144.

In addition, when performing the process of segmenting the data conversion request, the data format converting unit 1132 may segment the data conversion request into processes in a plurality of stages of the data conversion, as a plurality of jobs corresponding to the processes. Hence, the data format converting unit 1132 of this embodiment may include a unit that does not perform the data conversion process and instead performs the process of segmenting the data conversion request. Details of the process of segmenting the data conversion request will be given later.

The processing unit of the data conversion may be in units of the conversion engines 120b included in the asynchronous data conversion services. Each of the plurality of jobs to which the data conversion request is segmented may be inserted, as the message, into the queue corresponding to the type of data conversion of the job. The process may thereafter be performed in a manner similar to the data conversion process described above.

Figure 15:
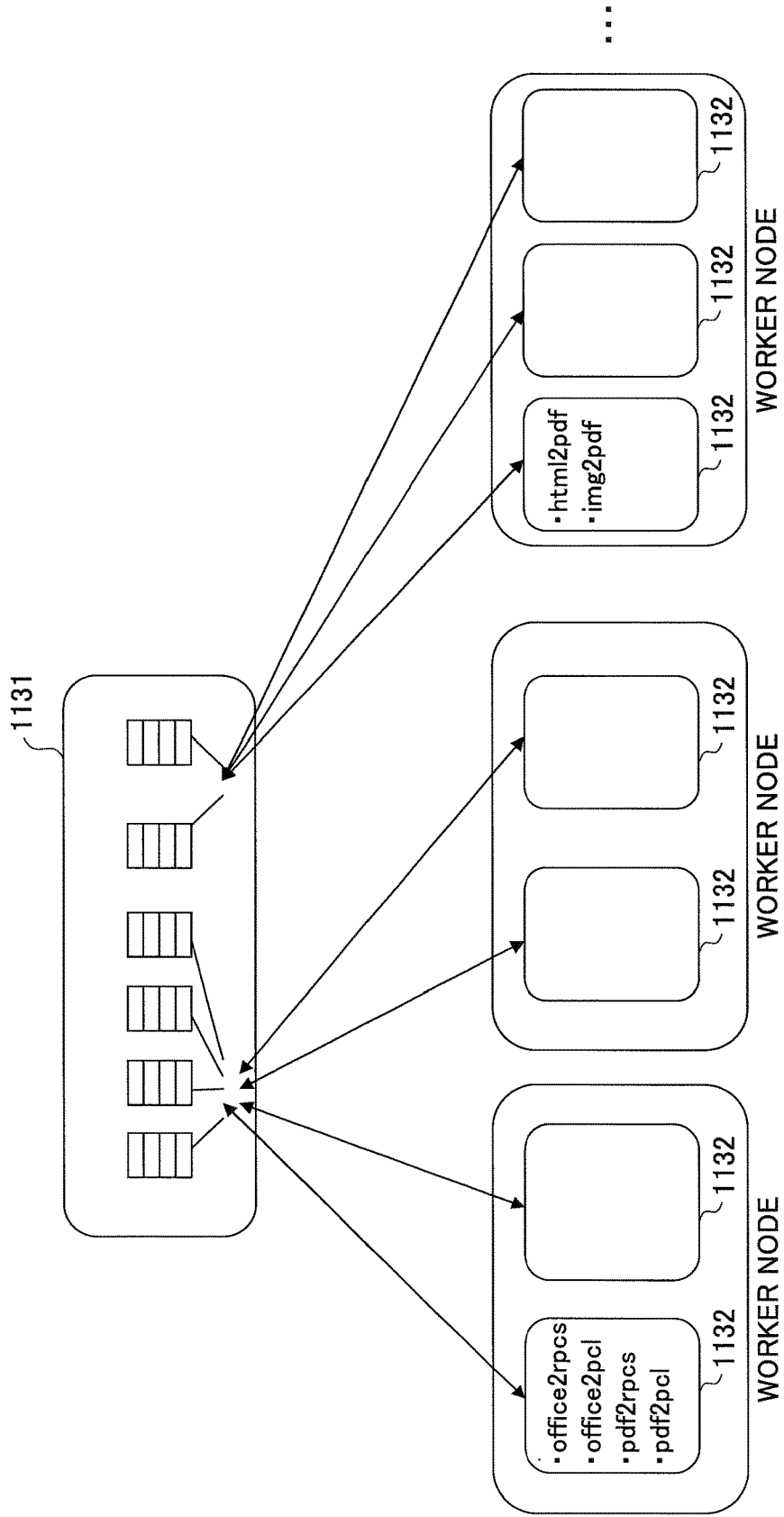
FIG. 15 is a diagram for explaining an example of a correspondence between queues and data format converting units.

The correspondence between the queues of the message queues 1131 and the data format converting units 1132 may be set as illustrated in FIG. 15, for example. FIG. 15 is a diagram for explaining an example of the correspondence between queues and data format converting units.

The message queues 1131 include the plurality of queues. The queues are separated for each type of data conversion, such as "office2rpcs". In addition, the data format converting units 1132 may operate on a Worker Node. For example, the Worker Node may be realized by a WINDOWS (registered trademark) server or a LINUX (registered trademark) server.

For example, two (2) data format converting units 1132 may operate on a single WINDOWS (registered trademark) server, while three (3) data format converting units 1132 may operate on a single LINUX (registered trademark) server.

FIG. 15 illustrates an example in which the data format converting units 1132 operating on the WINDOWS (registered trademark) server may perform the data conversion processes "office2rpcs", "office2 pcl", "pdf2rpcs", and "pdf2 pcl", and the data format converting units 1132 operating on the LINUX (registered trademark) server may perform the data conversion processes "html2pdf" and "img2pdf".

As illustrated in FIG. 15, the data format converting unit 1132 may perform polling of the jobs of the plurality of queues by a single connection. A range of the plurality of queues that may be polled by the single connection may be set to a range of the data format converting units 1132 operable on a single OS server, for example.

Figure 16:
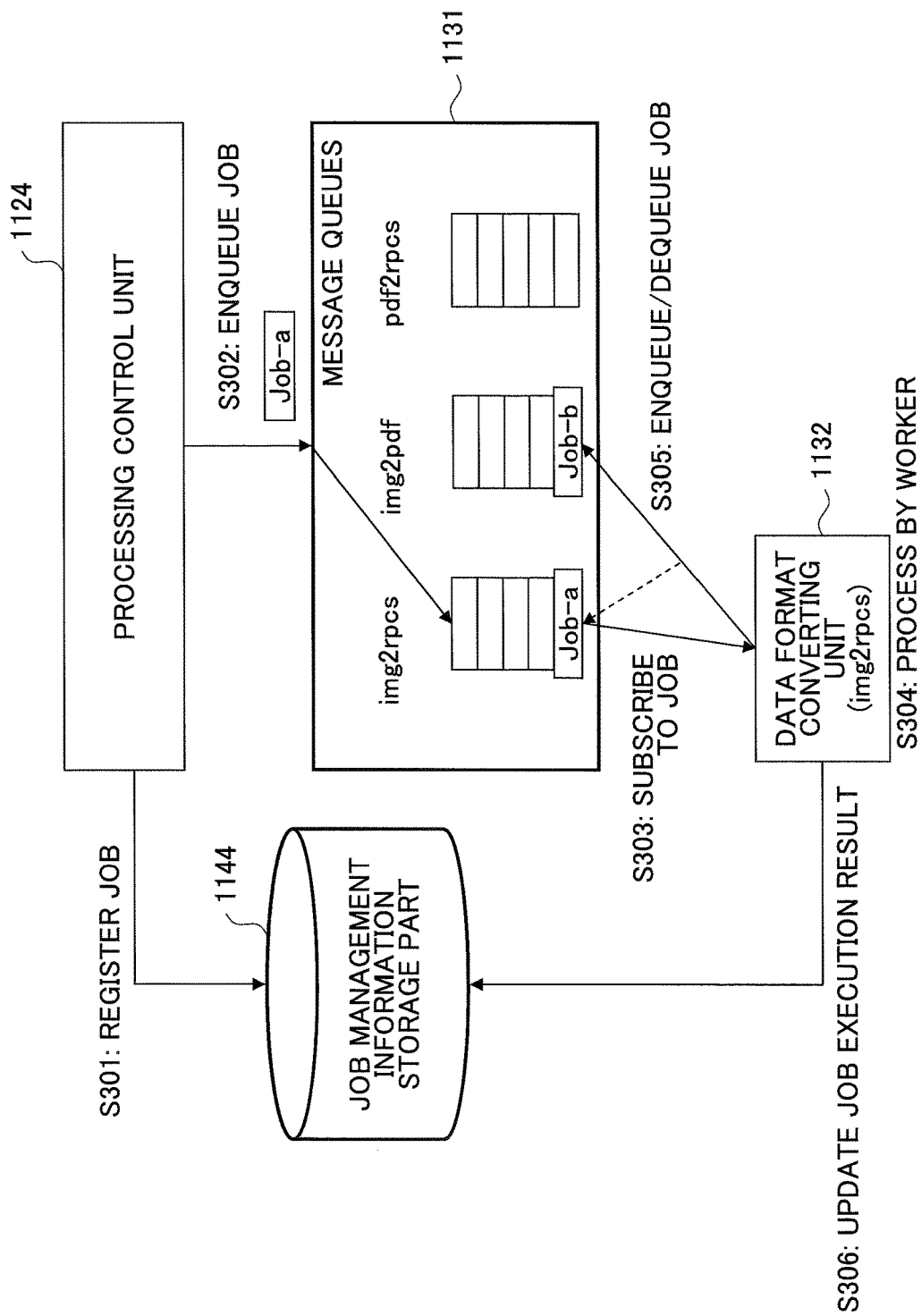
FIG. 16 is a diagram for explaining an example of a process of segmenting a data conversion request.
Figure 17:
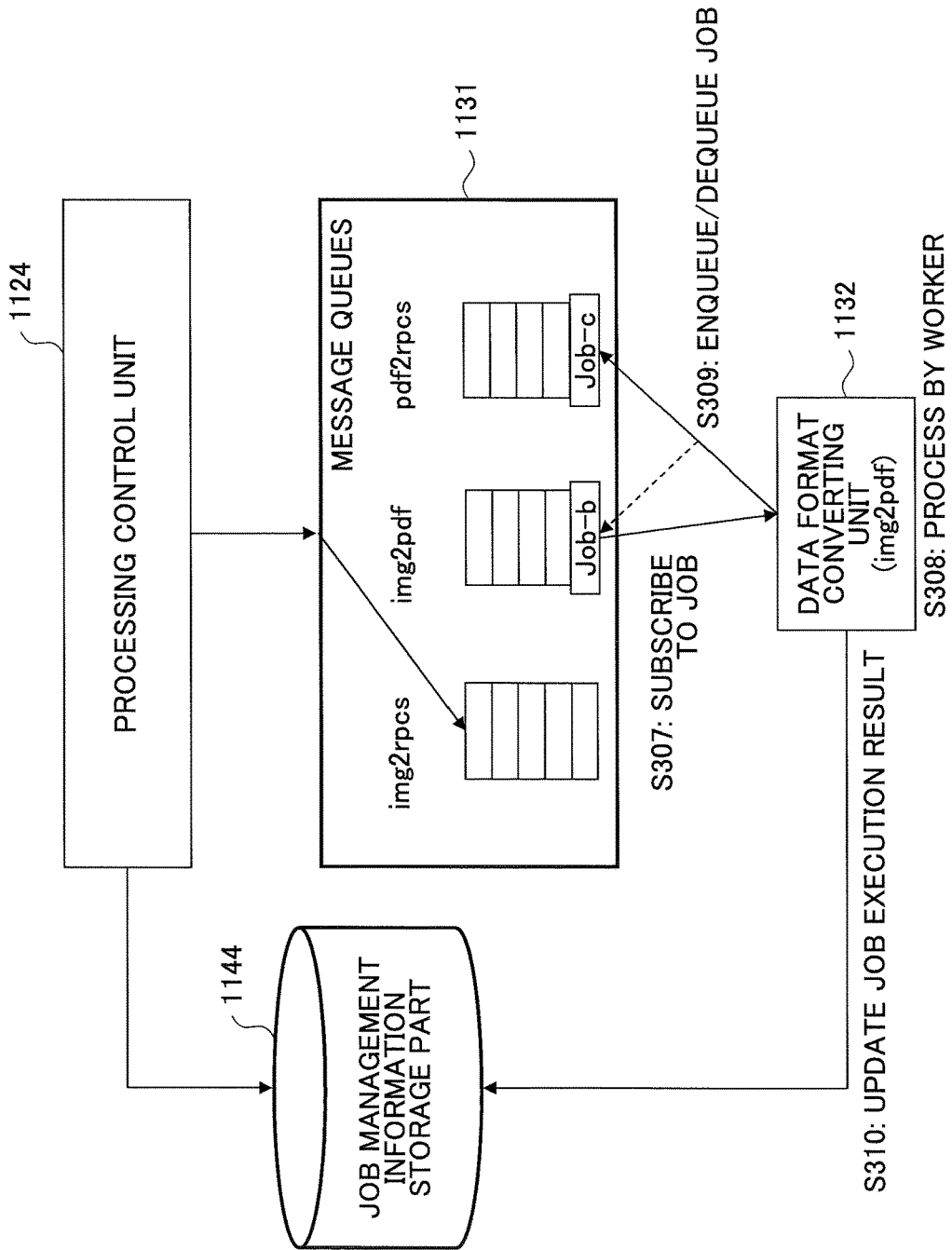
FIG. 17 is a diagram for explaining the example of the process of segmenting the data conversion request.
Figure 18:
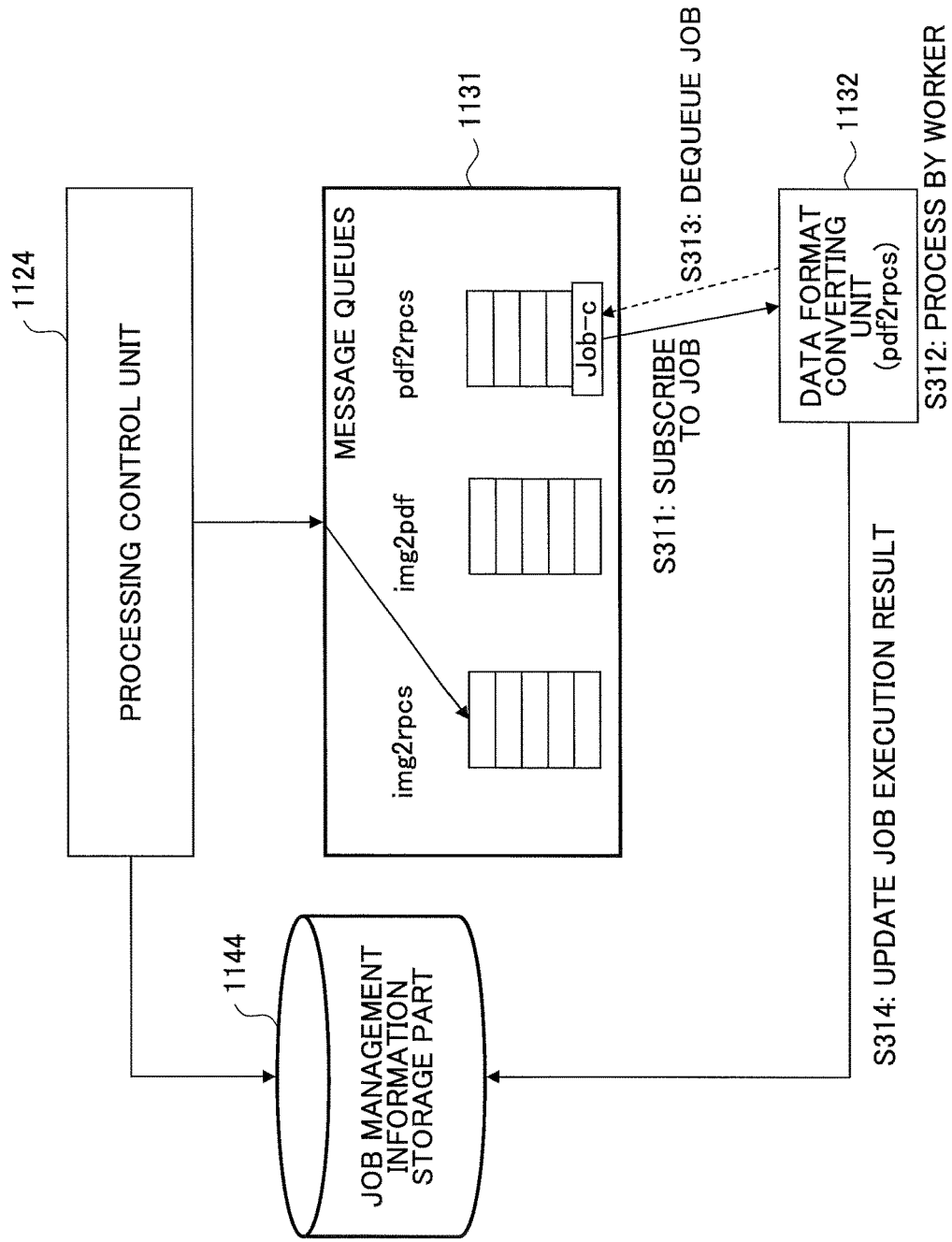
FIG. 18 is a diagram for explaining the example of the process of segmenting the data conversion request.

A description will be given of an example of the process of segmenting the data conversion request for a case in which the data conversion process is "img2rpcs". FIGS. 16 through 18 are diagrams for explaining the example of the process of segmenting the data conversion request.

The processes in step S301 and steps subsequent thereto may be performed after the processing control unit 1124 receives from the front end application 1111a the data conversion request including at least the type of data conversion, "img2rpcs", and the URI of the data.

In step S301, the processing control unit 1124 may register the data conversion request received from the front end application 1111a, as a job, in the management information storage part 1144.

In step S302, the processing control unit 1124 may insert (or enqueue) the data conversion request received from the front end application 1111a, as a job "a" (Job-a), into the queue corresponding to the type of data conversion, "img2rpcs".

The data format converting unit 1132 corresponding to the type of data conversion, "img2rpcs", monitors the corresponding queue, and in step S303, acquires the job "a" enqueued in the queue (subscribes to job). In step S304, the data format converting unit 1132 may perform a process corresponding to the job "a".

Next, a description will be given of the process of the data format converting unit 1132 performed in step S304, by referring to FIG. 19. FIG. 19 is a diagram for explaining an example of the process of step S304. In FIG. 19, the data format converting unit 1132 is identified as a Worker. In addition, FIG. 19 illustrates states of virtual task queues. The virtual task queue refers to a sequence (or queue) held within the Worker.

In (1) of FIG. 19, a task "img2rpcs" corresponding to the job "a" acquired by the data format converting unit 1132 exists in the task queue. In (2) of FIG. 19, the data format converting unit 1132 corresponding to the type of data conversion, "img2rpcs", adds, to the task queue, tasks "img2pdf" and "pdf2rpcs" that are required to perform the data conversion from the image file to the RPCS.

In (3) of FIG. 19, the data format converting unit 1132 checks the task "img2rpcs" at the start (or head) of the task queue, and deletes (dequeues) the job "a" from the queue corresponding to the type of data conversion, "img2rpcs".

In (4) of FIG. 19, the data format converting unit 1132 deletes the task "img2rpcs" at the start of the task queue. In addition, in (5) of FIG. 19, the data format converting unit 1132 checks the task "img2pdf" at the start of the task queue, and enqueues a job "b" into the queue corresponding to the type of data conversion, "img2pdf".

The deletion of the job "a" in (3) of FIG. 19 and the enqueueing of the job "b" in (5) of FIG. 19 may be performed by the process of step S305 illustrated in FIG. 16.

Returning now to the description of FIG. 16, after the job "a" is detected and the job "b" is enqueued in step S305 (enqueue/dequeue job), the data format converting unit 1132 corresponding to the type of data conversion, "img2rpcs", may write execution results of the job "a" to the job management information storage part 1144 in step S306. After the execution results of the job "a" are written in step S306, the job management information may become as illustrated in FIG. 20.

FIG. 20 is a diagram illustrating an example of a data structure of the job management information after the execution results of the job "a" are written. As illustrated in FIG. 20, "character string indicating that segmenting has been made" is written, as the execution result, into the job management information. In this example, the status is "doing" to indicate that the data conversion process of "img2rpcs" is being executed.

In step S307 of FIG. 17, the data format converting unit 1132 corresponding to the type of data conversion, "img2rpcs", may acquire the job "b" enqueued in the queue that is being monitored (subscribe to job). In step S308, the data format converting unit 1132 may perform a process corresponding to the job "b".

Next, a description will be given of the process of the data format converting unit 1132 performed in step S308, by referring to FIG. 21. FIG. 21 is a diagram for explaining an example of the process of step S308.

In (1) of FIG. 21, tasks "img2pdf" and "pdf2rpcs" exist in the task queue. In (2) of FIG. 21, the data format converting unit 1132 corresponding to the type of data conversion, "img2pdf", checks the task "img2pdf" at the start of the task queue, and performs a process that includes acquiring the file from the data storage 1145, opening the file, converting the data of the file, uploading the file, and deleting (dequeueing) the job "b".

In (3) of FIG. 21, the data format converting unit 1132 deletes the task "img2pdf" at the start of the task queue. In (4) of FIG. 21, the data format converting unit 1132 checks the task "pdf2rpcs" at the start of the task queue, and enqueues a job "c" into the queue corresponding to the type of data conversion, "pdf2prcs".

The deletion of the job "b" in (2) of FIG. 21 and the enqueueing of the job "c" in (4) of FIG. 21 may be performed by the process of step S309 illustrated in FIG. 17.

Returning now to the description of FIG. 17, after the job "b" is detected and the job "c" is enqueued (enqueue/dequeue job) in step S309, the data format converting unit 1132 corresponding to the type of data conversion, "img2pdf", may write execution results of the job "b" to the job management information storage part 1144 in step S310. After the execution results of the job "b" are written in step S310, the job management information may become as illustrated in FIG. 22.

FIG. 22 is a diagram illustrating an example of a data structure of the job management information after execution results of the job "b" are written. As illustrated in FIG. 22, the job management includes, as the execution result, information "A.pdf of data storage" indicating the location of the converted file in the data storage 1145. In this example, the status is "doing" to indicate that the data conversion process of "img2rpcs" is being executed.

In addition, in step S311 illustrated in FIG. 18, the data format converting unit 1132 corresponding to the type of data conversion, "pdf2rpcs", may acquire the job "c" enqueued in the queue that is being monitored (subscribe to job). In step S312, the data format converting unit 1132 may perform a process corresponding to the job "c".

Next, a description will be given of the process of the data format converting unit 1132 in step S312, by referring to FIG. 23. FIG. 23 is a diagram for explaining an example of the process of step S312.

In (1) of FIG. 23, a task "pdf2rpcs" exists in the task queue. In (2) of FIG. 23, the data format converting unit 1132 corresponding to the type of data conversion, "pdf2rpcs", checks the task "pdf2rpcs" at the start of the task queue, and performs a process that includes acquiring the file from the data storage 1145, opening the file, converting the data of the file, uploading the file, and deleting (dequeueing) the job "c".

In (3) of FIG. 23, the data format converting unit 1132 deletes the task "pdf2rpcs" at the start of the task queue. When the task "pdf2rpcs" is deleted, the task queue becomes empty. The deletion of the job "b" in (2) of FIG. 23 may be performed by step S313 illustrated in FIG. 18.

Returning now to the description of FIG. 18, after the job "c" is deleted in step S313 (dequeue job), the data format converting unit 1132 corresponding to the type of data conversion, "pdf2rpcs", may write the execution results of the job "c" to the job management information storage part 1144 in step S314. After the execution results of the job "c" are written in step S314, the job management information may become as illustrated in FIG. 24.

FIG. 24 is a diagram illustrating an example of a data structure of the job management information after execution results of the job "c" are written. As illustrated in FIG. 24, the job management includes, as the execution result, information "A.rpcs of data storage" indicating the location of the converted file in the data storage 1145. In this example, the status is "done" to indicate that the data conversion process of "img2rpcs" is completed.

Figure 25:
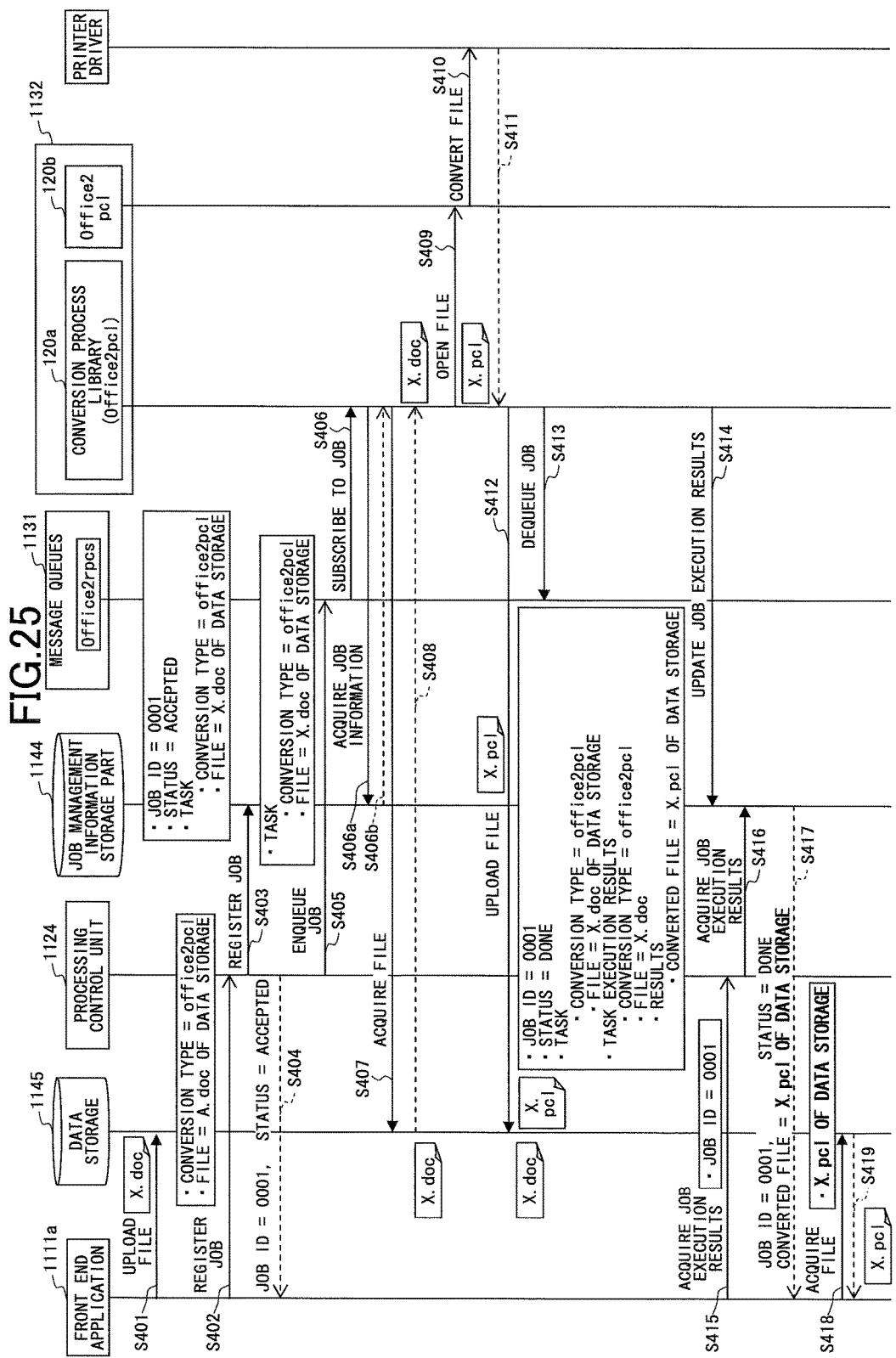
FIG. 25 is a sequence diagram illustrating an example of an asynchronous data conversion process utilizing a single data format converting unit.

FIG. 25 is a sequence diagram illustrating an example of the asynchronous data conversion process utilizing a single data format converting unit. The example illustrated in FIG. 25 will be described for a case in which the type of data conversion is "office2 pcl".

In step 401 illustrated in FIG. 25, the front end application 1111a may receive a print job from the input end apparatus such as the client terminal 1011, and upload the file included in the print job, such as the electronic document file, to the data storage 1145. In step S403, the front end application 1111a may judge the file conversions required to execute the print job, and request the processing control unit 1124 to register the job having the type of data conversion (conversion type) and the information indicating the location where the file exists, as parameters of the job.

In step S403, the processing control unit 1124 may register, in the job management information storage part 1144, the job the registration of which is requested from the front end application 1111a. In step S404, the processing control unit 1124 may notify, to the front end application 1111a from which the job registration request is received, a job ID and a status "accepted" indicating that the jog registration is accepted.

In step S405, the processing control procedure 1124 may enqueue the job into the queue corresponding to the type of data conversion, "office2 pcl". The data format converting unit 1132 corresponding to the type of data conversion, "office2 pcl", may monitor the corresponding queue, and acquire the job enqueued in the queue in step S406.

In steps S406a and S406b, the conversion process library 120a of the data format converting unit 1132 that acquired the job may acquire the job information corresponding to the acquired job from the job management information storage part 1144.

In steps S407 and S408, the conversion process library 120a of the data format converting unit 1132 that acquired the job may check the job information, and acquire the file before the conversion from the data storage 1145. In step S409, the conversion process library 120a may request the conversion engine 120b corresponding to the type of data conversion, "office2 pcl", to open the file. After the file is opened, the conversion engine 120b may request the conversion of the file to the printer driver in step S410. In step S411, the printer driver may send the converted file to the conversion process library 120a.

In step S415, the conversion process library 120a may upload the converted file to the data storage 1145. In addition, the conversion process library 120a may delete the job from the queue corresponding to the type of data conversion, "office2 pcl". In step S414, the conversion process library 120a may write the execution results of the job to the job management information storage part 1144, in order to update the job management information.

In step S415, the front end application 1111a may specify the job ID, and request the processing control unit 1124 to acquire the execution results of the job. In steps S416 and S417, the processing control unit 1124 may send the execution results of the job corresponding to the job ID to the front end application 1111a.

In steps S418 and S419, the front end application 1111a may acquire the converted file by utilizing the information, included in the execution results of the job, and indicating the location where the converted file exists.

Figure 26:
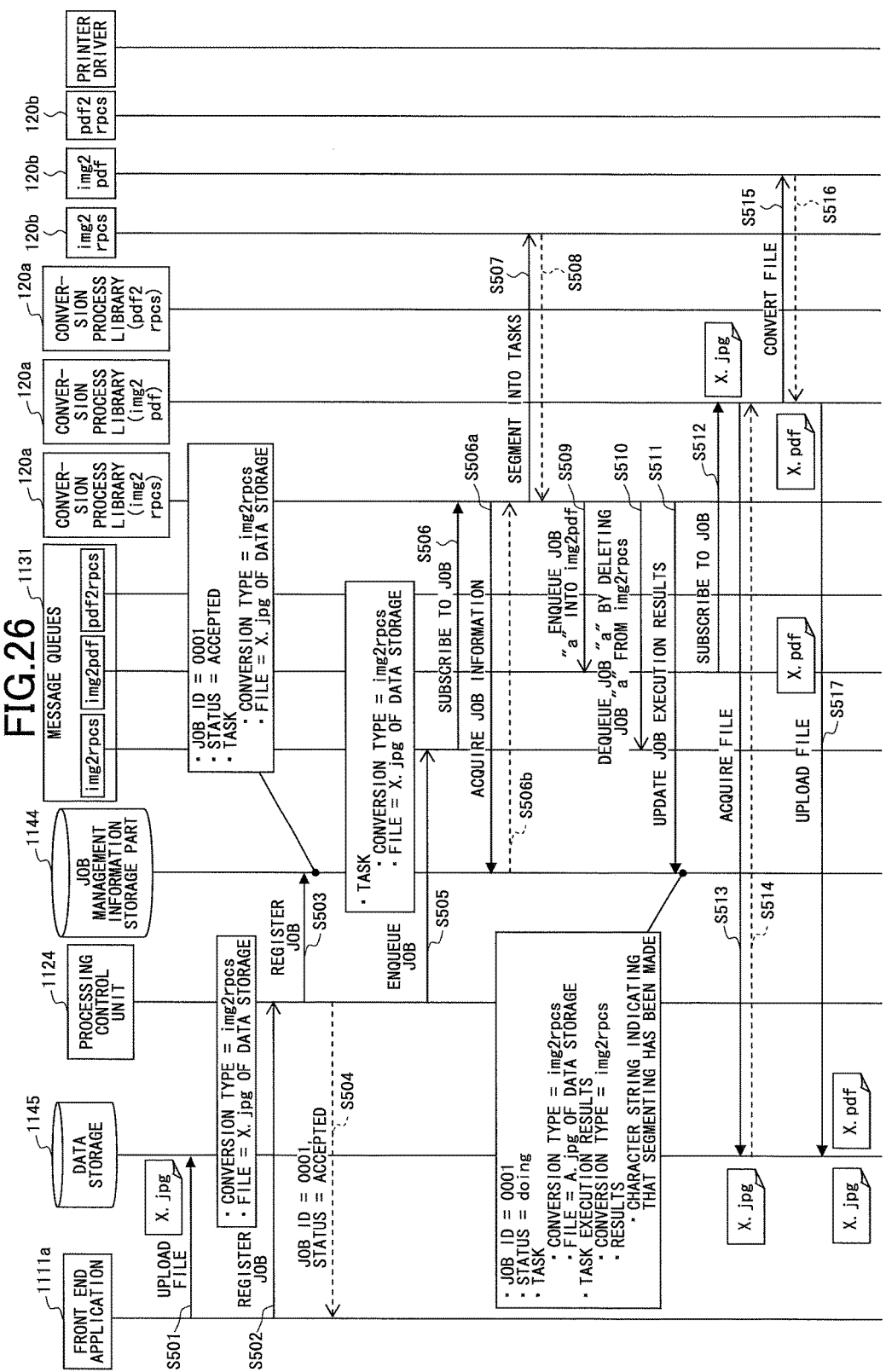
FIG. 26 is a sequence diagram illustrating an example of the asynchronous data conversion process utilizing a plurality of data format converting units.

FIGS. 26 and 27 are sequence diagrams illustrating an example of the asynchronous data conversion process utilizing a plurality of data format converting units. The example illustrated in FIGS. 26 and 27 will be described for a case in which the type of data conversion is "img2rpcs".

In step S501 illustrated in FIG. 26, the front end application 1111a may receive a print job from the input end apparatus such as the client terminal 1011, and upload the file included in the print job, such as the electronic document file, to the data storage 1145. In step S502, the front end application 1111a may judge the file conversions required to execute the print job, and request the processing control unit 1124 to register the job having the type of data conversion (conversion type) and the information indicating the location where the file exists, as parameters of the job.

In step S503, the processing control unit 1124 may register, in the job information storage part 1144, the job requested from the front end application 1111a. In step S504, the processing control unit 1124 may notify, to the front end application 1111a that requested registration of the job, the job ID and a status "accepted" indicating that the job registration is accepted.

In step S505, the processing control unit 1124 may enqueue a job "a" in the queue corresponding to the type of data conversion, "img2rpcs". The conversion process library 120a of the data format converting unit 1132 corresponding to the type of data conversion, "img2rpcs", may monitor the corresponding queue, and acquire the job "a" enqueued in the queue in step S506.

In steps S506a and S506b, the conversion process library 120a that acquired the job "a" may acquire the job information corresponding to the job "a" from the job management information storage part 1144.

In steps S507 and S508, the conversion process library 120a of the data format converting unit 1132 corresponding to the type of data conversion, "img2rpcs", causes the conversion engine 120b corresponding to the type of data conversion, "img2rpcs", to segment the job into tasks. For example, the conversion engine 120b may segment the job into tasks "img2pdf" and "pdf2rpcs" that are required to perform the data conversion from the image file into the RPCS.

In step S509, the conversion process library 120a corresponding to the type of data conversion, "img2rpcs", may enqueue a job "b" in the queue corresponding to the type of data conversion, "img2pdf". In addition, in step S510, the conversion process library 120a may delete the job "a". In step S511, the conversion process library 120a corresponding to the type of data conversion, "img2rpcs", may write the execution results of the job "a" into the job management information storage part 1144.

The conversion process library 120a corresponding to the type of data conversion, "img2pdf", may monitor the corresponding queue, and acquire the job "b" enqueued in the queue in step S512.

In steps S513 and S514, the conversion process library 120a of the data format converting unit 1132 that acquired the job may check the job information, and acquire the file before the conversion from the data storage 1145. In step S515, the conversion process library 120a may request the conversion engine 120b corresponding to the type of data conversion, "img2pdf", to convert the file. In step S516, the conversion engine 120b corresponding to the type of data conversion, "img2pdf", may send the converted file to the conversion process library 120a.

In step S517, the conversion process library 120a may upload the converted file to the data storage 1145. In step S518, the conversion process library 120a may enqueue a job "c" into the queue corresponding to the type of data conversion, "pdf2rpcs". In addition, in step S519, the conversion process library 120a may delete the job "b". In step S520, the conversion process library 120a corresponding to the type of data conversion, "img2pdf", may write the execution results of the job "b" to the job management information storage part 1144.

The conversion process library 120a corresponding to the type of data conversion, "pdf2rpcs", may monitor the corresponding queue, and acquire the job "c" enqueued in the queue in step S521.

In steps S522 and S523, the conversion process library of the data format converting unit 1132 that acquired the job may check the job information, and acquire the file before the conversion from the data storage 1145. In step S524, the conversion process library 120a may request the conversion engine 120b corresponding to the type of data conversion, "pdf2rpcs", to convert the file. In steps S525 through S527, the conversion engine 120b corresponding to the type of data conversion, "pdf2rpcs", and the printer driver, may send the converted file to the conversion process library 120a.

In step S528, the conversion process library 120a may upload the converted file to the data storage 1145. In step S529, the conversion process library 120a may delete the job "c". In step S530, the conversion process library 120a corresponding to the type of data conversion, "pdf2rpcs", may write the execution results of the job "c" to the job management information storage 1144.

In step S531, the front end application 1111a may specify the job ID, and request the processing control unit 1124 to acquire the execution results of the job. In steps S532 and S533, the processing control unit 1124 may send the execution results of the job corresponding to the job ID to the front end application 1111a.

In steps S534 and S535, the front end application 1111a may acquire the converted file by utilizing the information, included in the execution results of the job, and indicating the location where the converted file exists.

Hence, according to this embodiment, the data conversion process may be performed by coordinating or linking a plurality of data format converting units 1132. For this reason, even when the number of options for the data formats before or after the conversion increases, the increase in the number of data conversion engines to be prepare or provided may be suppressed compared to the conventional techniques. As a result, this embodiment may flexibly cope with the increase in the number of data formats before or after the conversion.

Therefore, according to the embodiments described above, the information processing apparatus, the information processing system, and the data conversion method may flexibly cope with the increase in the number of types of data conversion processes.

Although the embodiments are numbered with, for example, "first," or "second," the ordinal numbers do not imply priorities of the embodiments. Many other variations and modifications will be apparent to those skilled in the art.

Further, the present invention is not limited to these embodiments, but various variations and modifications may be made without departing from the scope of the present invention.

What is claimed is:

1. An information processing apparatus comprising:
a storage configured to store a program; and
a processor, accessible to a database, and configured to execute the program to perform a process including
accepting a single conversion request to convert electronic data in a first data format into electronic data in a second data format that is different from the first data format, the single conversion request specifying a storage location of the electronic data in the first data format and a type of data conversion from the first data format to the second data format;
analyzing the single conversion request to obtain an analysis result; and
coordinating two or more converting units from among a plurality of converting units, based on the type of data conversion specified by the single conversion request, to generate the electronic data in the second data format, from the electronic data in the first data format read from the storage location specified by the single conversion request, by data conversions of the two or more converting units that are coordinated, when the analysis result indicates that the data conversion from the first data format to the second data format cannot be executed by a single converting unit from among the plurality of converting units,
wherein the accepting inserts a message into one of a plurality of message queues that matches the type of data conversion specified by the single conversion request, and registers information of the single conversion request in the database as registered information upon insertion of the message into the one of the plurality of message queues,
wherein the plurality of message queues respectively correspond to the plurality of converting units, and each of the plurality of converting units monitors a corresponding one of the plurality of message queues,
wherein upon the insertion of the message into the one of the plurality of message queues, one of the plurality of converting units corresponding to the one of the plurality of message queues acquires the registered information of the single conversion request corresponding to the message from the database and acquires the electronic data in the first data format from the storage location specified by the single conversion request,
wherein the plurality of converting units respectively execute a data conversion from one data format to another data format,
wherein one of the two or more converting units executes a data conversion from the first data format, wherein another of the two or more converting units executes a data conversion to the second data format, and wherein among the two or more converting units that are coordinated to perform the data conversion, each converting unit after performing the data conversion inserts a new message into one of the plurality of message queues corresponding to one of the plurality of converting units that is to perform the data conversion next.

2. The information processing apparatus as claimed in claim 1, wherein the coordinating coordinates the data conversion by three or more converting units when the analysis result indicates that the data conversion from the first data format to the second data format cannot be executed by the single converting unit.

3. The information processing apparatus as claimed in claim 1, wherein the processor performs the process further including segmenting the data conversion from the first data format to the second data format into data conversions of the two or more converting units to generate the electronic data in the second data format, wherein the coordinating coordinates the two or more converting units respectively corresponding to segmented data conversions segmented by the segmenting.

4. The information processing apparatus as claimed in claim 3, wherein the segmenting adds a conversion request corresponding to the segmented data conversions to the single conversion request accepted by the accepting.

5. The information processing apparatus as claimed in claim 1, wherein the coordinating coordinates the data conversion by three or more converting units from among the plurality of converting units when the analysis result indicates that the data conversion from the first data format to the second data format cannot be executed by the single converting unit, and wherein the processor performs the process further including segmenting the data conversion from the first data format to the second data format into data conversions of the three or more converting units to generate the electronic data in the second data format, wherein the coordinating coordinates the three or more converting units respectively corresponding to segmented data conversions segmented by the segmenting, so that at least one of the three or more converting units executes a process of segmenting the single conversion request instead of performing a data conversion.

6. The information processing apparatus as claimed in claim 1, wherein the single conversion request is embedded with a Uniform Resource Indicator of the storage location, and the type of data conversion.

7. An information processing system comprising:

a plurality of computer systems, wherein one of the plurality of computer systems comprises a storage configured to store a program, and a processor, accessible to a database, and configured to execute the program to perform a process including accepting a single conversion request to convert electronic data in a first data format into electronic data in a second data format that is different from the first data format, the single conversion request specifying a storage location of the electronic data in the first data format and a type of data conversion from the first data format to the second data format;

analyzing the single conversion request to obtain an analysis result; and coordinating two or more converting units from among a plurality of converting units, based on the type of data conversion specified by the single conversion request, to generate the electronic data in the second data format, from the electronic data in the first data format read from the storage location specified by the single conversion request, by data conversions of the two or more converting units that are coordinated, when the analysis result indicates that the data conversion from the first data format to the second data format cannot be executed by a single converting unit from among the plurality of converting units, wherein the accepting inserts a message into one of a plurality of message queues that matches the type of data conversion specified by the single conversion request, and registers information of the single conversion request in the database as registered information upon insertion of the message into the one of the plurality of message queues, wherein the plurality of message queues respectively correspond to the plurality of converting units, and each of the plurality of converting units monitors a corresponding one of the plurality of message queues, wherein upon the insertion of the message into the one of the plurality of message queues, one of the plurality of converting units corresponding to the one of the plurality of message queues acquires the registered information of the single conversion request corresponding to the message from the database and acquires the electronic data in the first data format from the storage location specified by the single conversion request, wherein the plurality of converting units respectively execute a data conversion from one data format to another data format, wherein one of the two or more converting units executes a data conversion from the first data format, wherein another of the two or more converting units executes a data conversion to the second data format, and wherein among the two or more converting units that are coordinated to perform the data conversion, each converting unit after performing the data conversion inserts a new message into one of the plurality of message queues corresponding to one of the plurality of converting units that is to perform the data conversion next.

8. The information processing system as claimed in claim 7, wherein the coordinating coordinates the data conversion by three or more converting units when the analysis result indicates that the data conversion from the first data format to the second data format cannot be executed by the single converting unit.

9. The information processing system as claimed in claim 7, wherein the processor performs the process further including segmenting the data conversion from the first data format to the second data format into data conversions of the two or more converting units to generate the electronic data in the second data format, wherein the coordinating coordinates the two or more converting units respectively corresponding to segmented data conversions segmented by the segmenting.

10. The information processing system as claimed in claim 9, wherein the segmenting adds a conversion request corresponding to the segmented data conversions to the single conversion request accepted by the accepting.

11. The information processing system as claimed in claim 7,
wherein the coordinating coordinates the data conversion by three or more converting units from among the plurality of converting units in when the analysis result indicates that the data conversion from the first data format to the second data format cannot be executed by the single converting unit,
wherein the processor performs the process further including
segmenting the data conversion from the first data format to the second data format into data conversions of the three or more converting units to generate the electronic data in the second data format,
wherein the coordinating coordinates the three or more converting units respectively corresponding to segmented data conversions segmented by the segmenting, so that at least one of the three or more converting units executes a process of segmenting the single conversion request instead of performing a data conversion.

12. The information processing system as claimed in claim 7, wherein the single conversion request is embedded with a Uniform Resource Indicator of the storage location, and the type of data conversion.

13. A data conversion method comprising:
accepting, by a processor that is accessible to a database, a single conversion request to convert electronic data in a first data format into electronic data in a second data format that is different from the first data format, the single conversion request specifying a storage location of the electronic data in the first data format and a type of data conversion from the first data format to the second data format;
analyzing the single conversion request to obtain an analysis result; and
coordinating, by the processor, two or more converting units from amongst among a plurality of converting units, based on the type of data conversion specified by the single conversion request, to generate the electronic data in the second data format, from the electronic data in the first data format read from the storage location specified by the single conversion request, by data conversions of the two or more converting units that are coordinated, when the analysis result indicates that the data conversion from the first data format to the second data format cannot be executed by a single converting unit from among the plurality of converting units,
wherein the accepting inserts a message into one of a plurality of message queues that matches the type of data conversion specified by the single conversion request, and registers information of the single conversion request in the database as registered information upon insertion of the message into the one of the plurality of message queues,
wherein the plurality of message queues respectively correspond to the plurality of converting units, and each of the plurality of converting units monitors a corresponding one of the plurality of message queues,
wherein upon the insertion of the message into the one of the plurality of message queues, one of the plurality of converting units corresponding to the one of the plurality of message queues acquires the registered information of the single conversion request corresponding to the message from the database and acquires the electronic data in the first data format from the storage location specified by the single conversion request,
wherein the plurality of converting units respectively execute a data conversion from one data format to another data format,
wherein one of the two or more converting units executes a data conversion from the first data format,
wherein another of the two or more converting units executes a data conversion to the second data format, and
wherein among the two or more converting units that are coordinated to perform the data conversion, each converting unit after performing the data conversion inserts a new message into one of the plurality of message queues corresponding to one of the plurality of converting units that is to perfonn the data conversion next.

14. The data conversion method as claimed in claim 13,
wherein the coordinating coordinates the data conversion by three or more converting units when the analysis result indicates that the data conversion from the first data format to the second data format cannot be executed by the single converting unit.

15. The data conversion method as claimed in claim 13, further comprising:
segmenting, by the processor, the data conversion from the first data format to the second data format into data conversions of the two or more converting units to generate the electronic data in the second data format;
wherein the coordinating coordinates the two or more converting units respectively corresponding to segmented data conversions segmented by the segmenting.

16. The data conversion method as claimed in claim 15, wherein the segmenting adds a conversion request corresponding to the segmented data conversions to the single conversion request accepted by the accepting.

17. The data conversion method as claimed in claim 13,
wherein the coordinating coordinates the data conversion by three or more converting units from among the plurality of converting units when the analysis result of the analyzing indicates that the data conversion from the first data format to the second data format cannot be executed by the single converting unit, and further comprising:
segmenting, by the processor, the data conversion from the first data format to the second data format into data conversions of the three or more converting units to generate the electronic data in the second data format,
wherein the coordinating coordinates the three or more converting units respectively corresponding to segmented data conversions segmented by the segmenting, so that at least one of the three or more converting units executes a process of segmenting the single conversion request instead of performing a data conversion.

18. The data conversion method as claimed in claim 13, wherein the single conversion request is embedded with a Uniform Resource Indicator of the storage location, and the type of data conversion.

* * * * *